United States Patent
Zhou

(10) Patent No.: US 10,833,062 B2
(45) Date of Patent: Nov. 10, 2020

(54) DIODE DESIGN OF FINFET DEVICE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 195 days.

(21) Appl. No.: 15/602,665

(22) Filed: May 23, 2017

(65) Prior Publication Data
US 2018/0040604 A1 Feb. 8, 2018

(30) Foreign Application Priority Data
Aug. 2, 2016 (CN) .......................... 2016 1 0622768

(51) Int. Cl.
H01L 27/02 (2006.01)
H01L 29/78 (2006.01)
(Continued)

(52) U.S. Cl.
CPC .... H01L 27/0255 (2013.01); H01L 21/26513 (2013.01); H01L 21/823821 (2013.01);
(Continued)

(58) Field of Classification Search
CPC ............. H01L 27/0255; H01L 27/0924; H01L 21/26513; H01L 21/82; H01L 29/0649; H01L 27/02
(Continued)

(56) References Cited

U.S. PATENT DOCUMENTS

2007/0241414 A1* 10/2007 Narihiro ............. H01L 27/1203
257/401
2009/0315112 A1 12/2009 Lee
(Continued)

FOREIGN PATENT DOCUMENTS

| CN | 102956692 | 3/2013 |
| CN | 105390442 | 3/2016 |

(Continued)

OTHER PUBLICATIONS

European Application No. 17183709.9, Extended European Search Report dated Dec. 19, 2017, 8 pages.
(Continued)

Primary Examiner — Marvin Payen
(74) Attorney, Agent, or Firm — Kilpatrick Townsend & Stockton LLP

(57) ABSTRACT

A method for manufacturing an electrostatic discharge (ESD) protection device includes providing a semiconductor structure including a semiconductor substrate including a first region of a first conductivity type and a semiconductor fin on the semiconductor substrate; forming an electrode on the semiconductor fin; and performing a doping process on the semiconductor structure to forming a second region in the first region, the second region having a second conductivity type opposite the first conductivity type to form a pn junction in the semiconductor substrate. Since the pn junction is formed in the semiconductor substrate, it has a relatively large area to prevent local hot spots from occur-
(Continued)

ring when a current flows through the ESD protection device, thereby reducing performance degradation of a semiconductor device.

19 Claims, 18 Drawing Sheets

(51) Int. Cl.
    *H01L 29/66*     (2006.01)
    *H01L 21/265*     (2006.01)
    *H01L 21/8238*     (2006.01)
    *H01L 27/092*     (2006.01)
    *H01L 29/06*     (2006.01)

(52) U.S. Cl.
    CPC ........ *H01L 21/823871* (2013.01); *H01L 21/823878* (2013.01); *H01L 27/0924* (2013.01); *H01L 29/0649* (2013.01); *H01L 29/66795* (2013.01); *H01L 29/7851* (2013.01)

(58) Field of Classification Search
    USPC .................................................. 257/355–362
    See application file for complete search history.

(56) References Cited

U.S. PATENT DOCUMENTS

| | | |
|---|---|---|
| 2014/0131831 A1 | 5/2014 | Wei et al. |
| 2015/0014809 A1 | 1/2015 | Wang et al. |
| 2015/0187753 A1 | 7/2015 | Campi, Jr. et al. |
| 2015/0194419 A1 | 7/2015 | Singh et al. |
| 2015/0263089 A1 | 9/2015 | Singh et al. |
| 2015/0311342 A1* | 10/2015 | Lin .................. H01L 29/7848 257/190 |
| 2016/0064371 A1 | 3/2016 | Lee et al. |
| 2016/0181358 A1 | 6/2016 | Zhang et al. |

FOREIGN PATENT DOCUMENTS

| | | |
|---|---|---|
| EP | 2770538 | 8/2014 |
| TW | 201423957 | 6/2014 |

OTHER PUBLICATIONS

Chinese Application No. 201610622768.1, Office Action dated May 20, 2019, 10 pages.

* cited by examiner

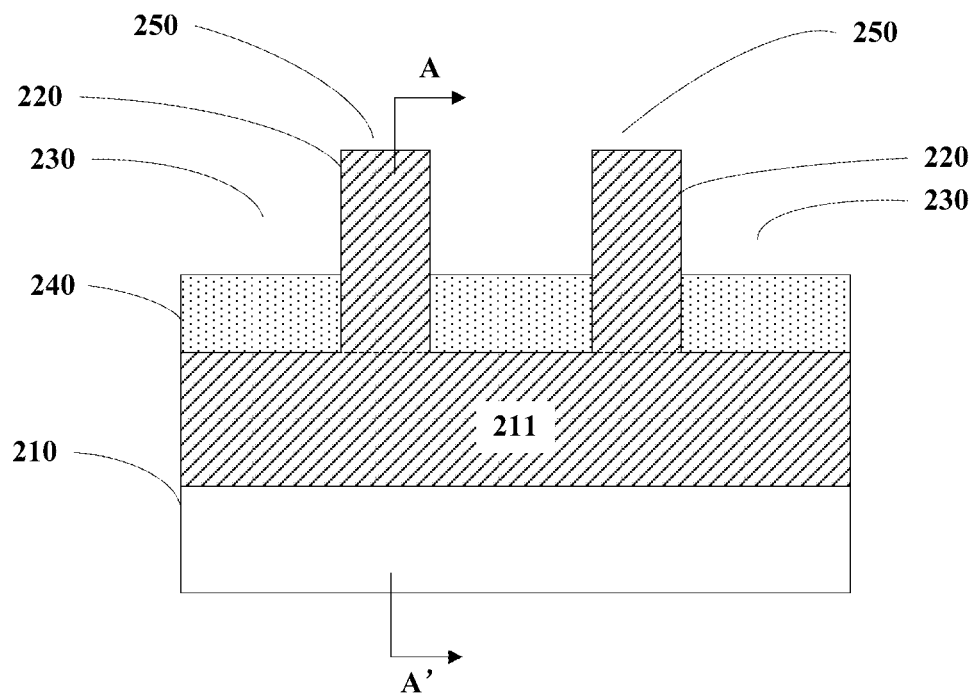
FIG. 2B1
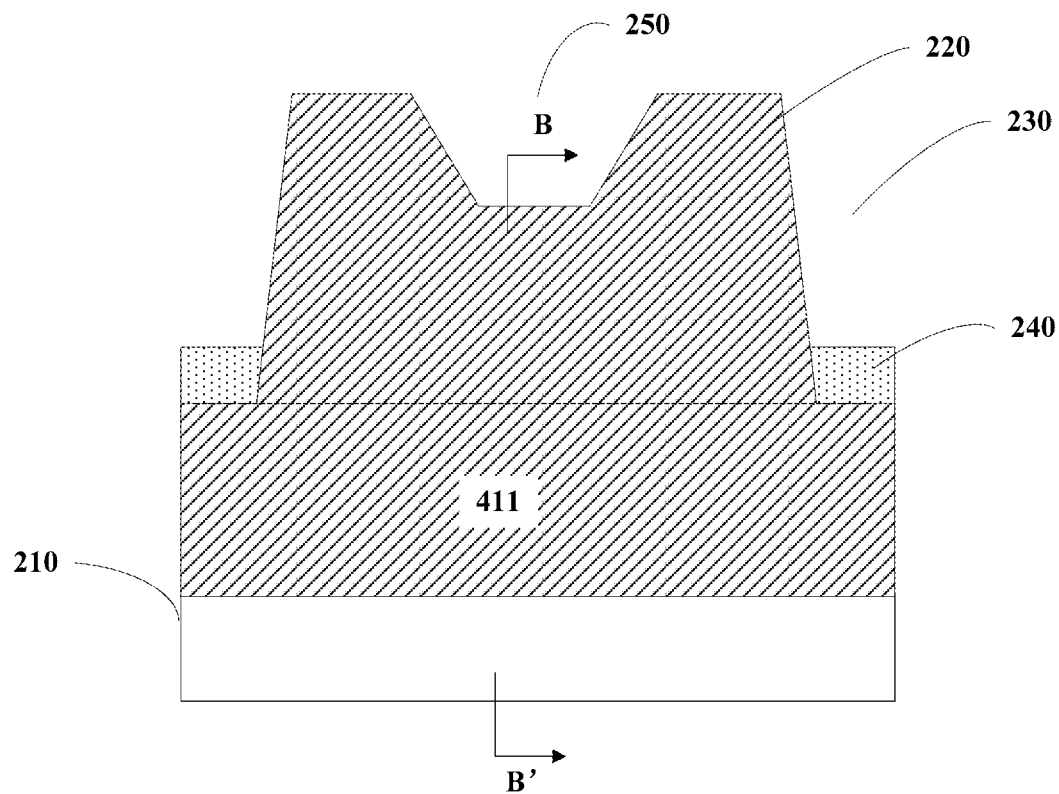
FIG. 2B2

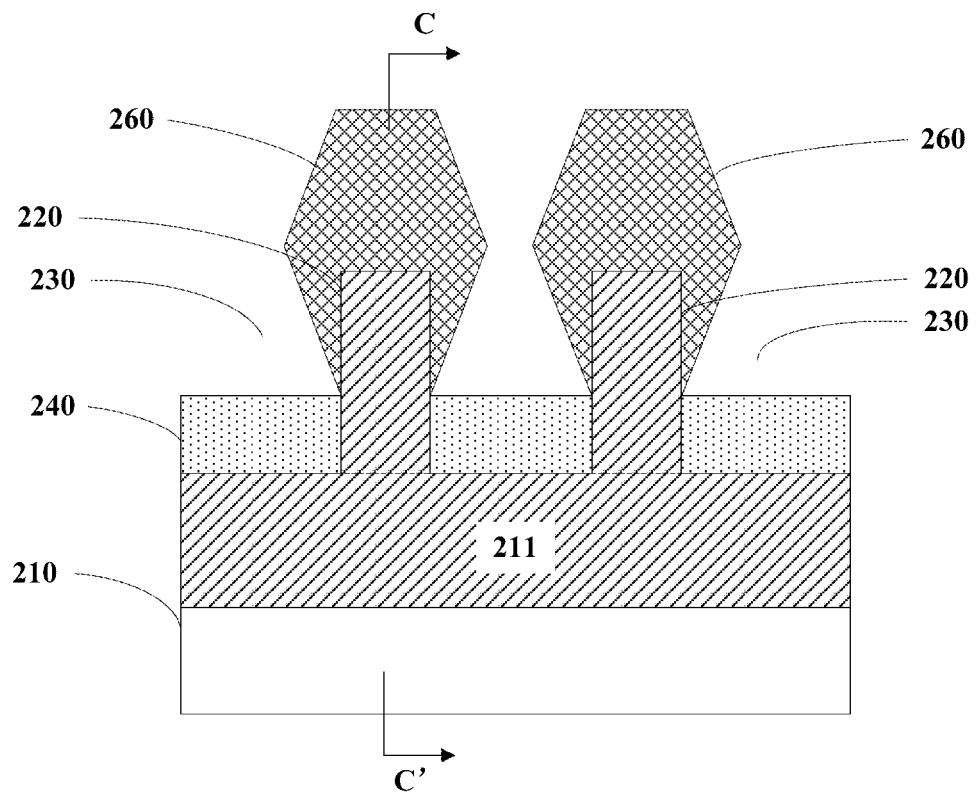
FIG. 2C1
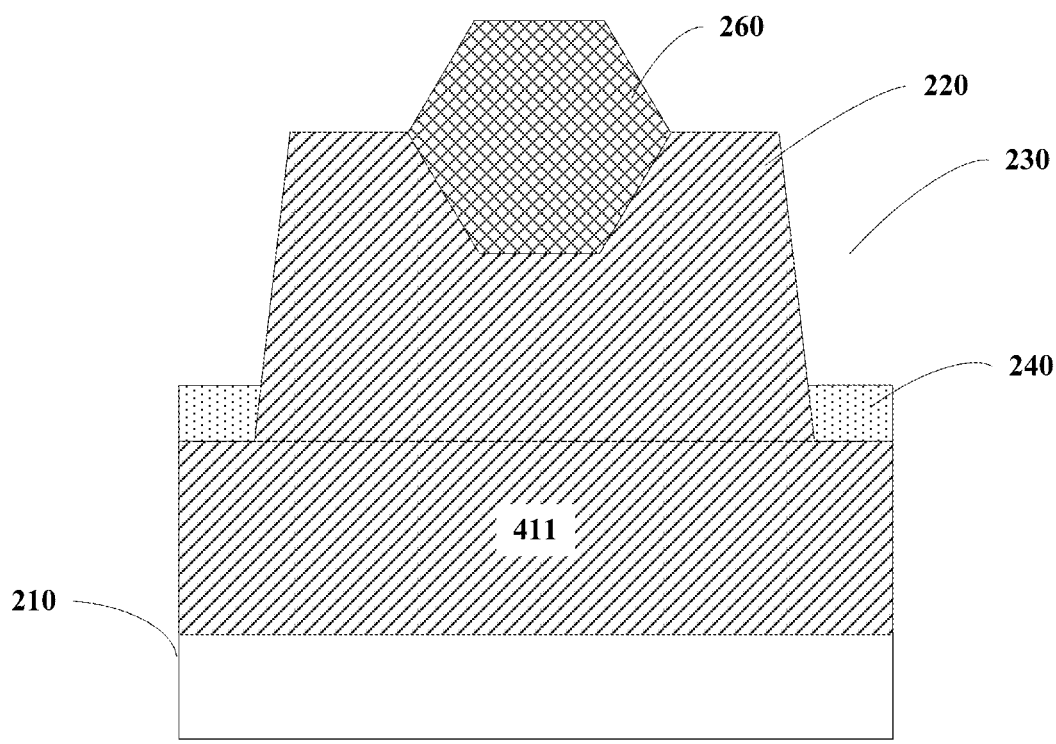
FIG. 2C2

Provide a semiconductor structure comprising a semiconductor substrate including a first region of a first conductivity type, first and second semiconductor fins on the semiconductor substrate and separated from each other, a trench surrounding the first and second fins, a first insulator layer partially filling the trench, the first insulator layer having a first portion around the first fin and a second portion around the second fin ～S301

Etch the first portion of the fist insulator layer such that the upper surface of the first portion is lower than the upper surface of the second portion ～S302

Form an electrode on the first fin; form a source and a drain on the second fin ～S303

Perform a doping process into the semiconductor substrate including formed the electrode, source and drain to form a second region of a second conductivity type opposite the first conductivity type in the first region to form a pn junction in the semiconductor sustrate ～S304

FIG. 3

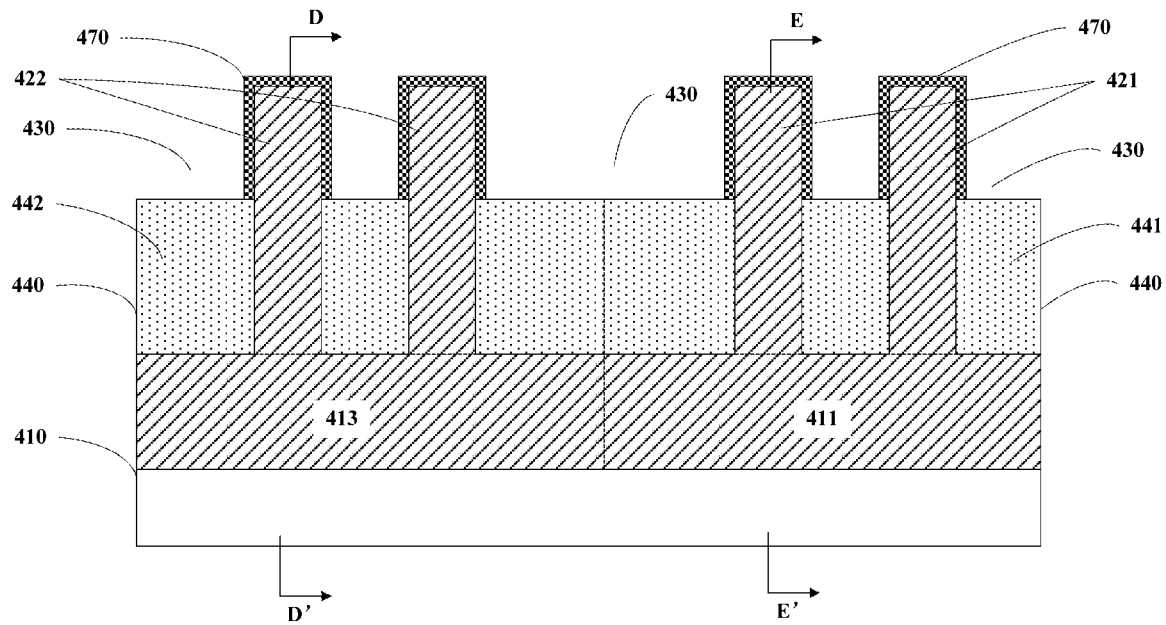

FIG. 4A

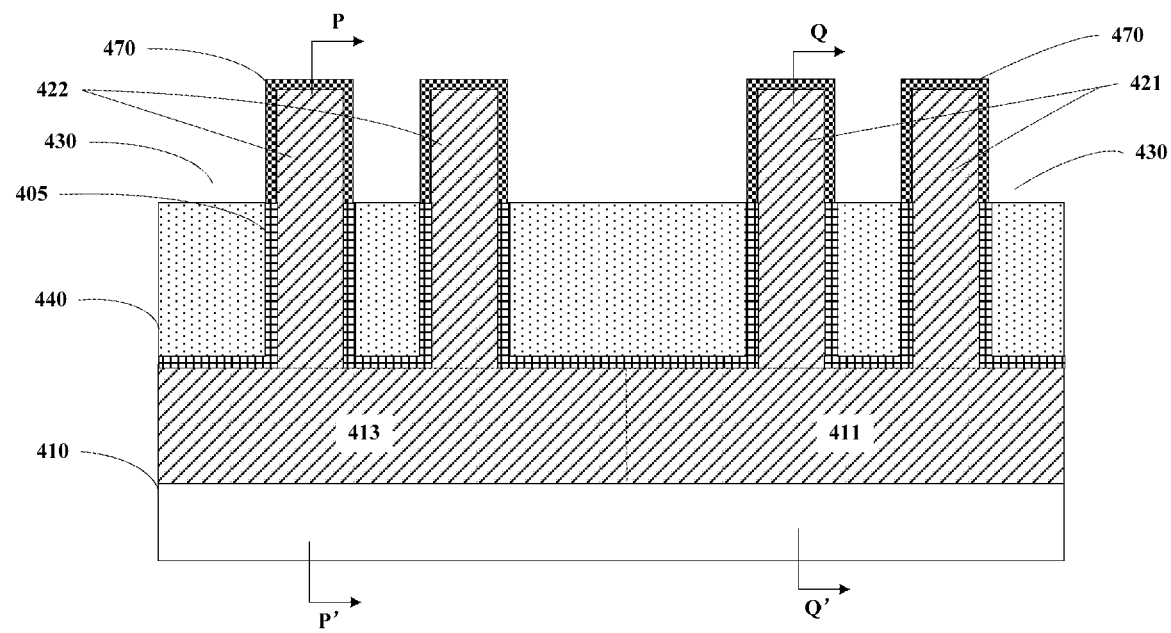
FIG. 12K1
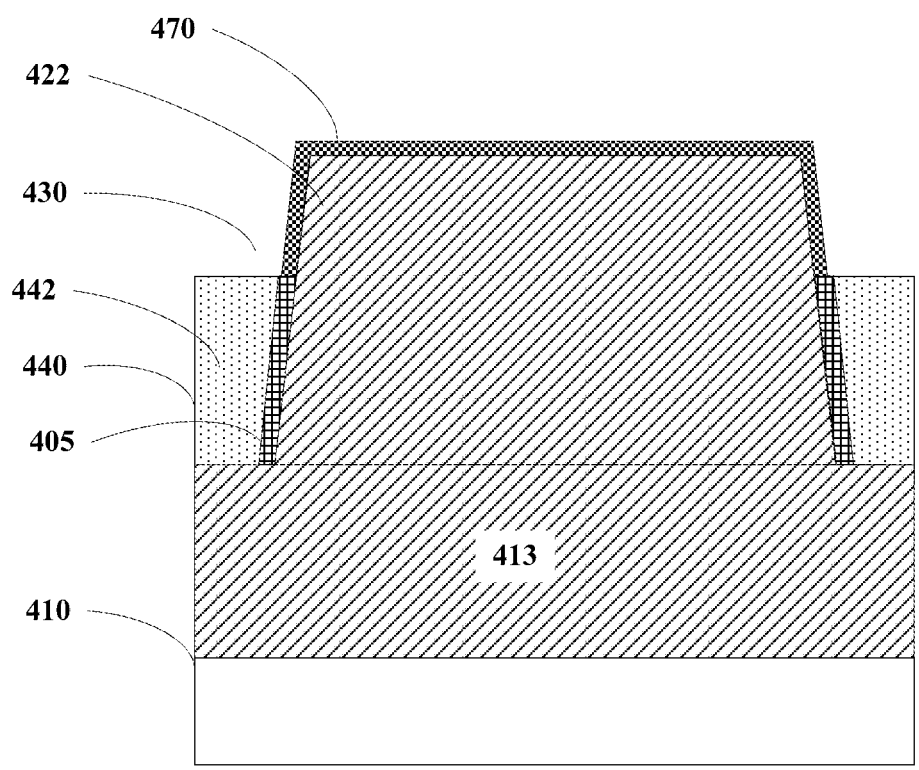
FIG. 12K2

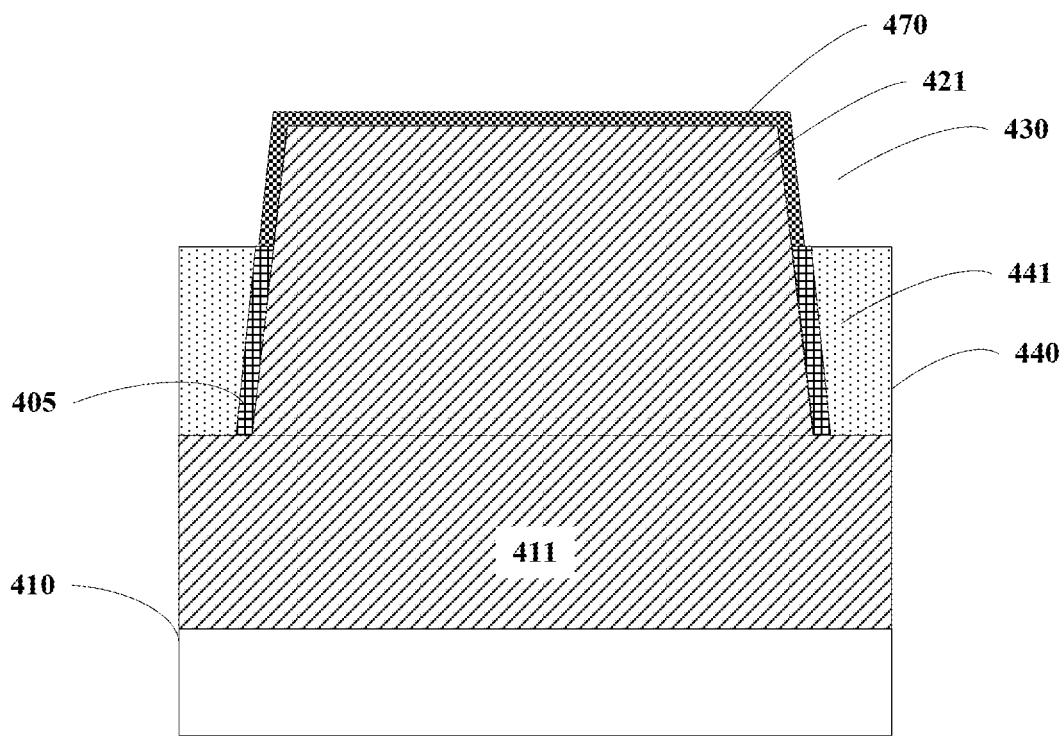
FIG. 12K3
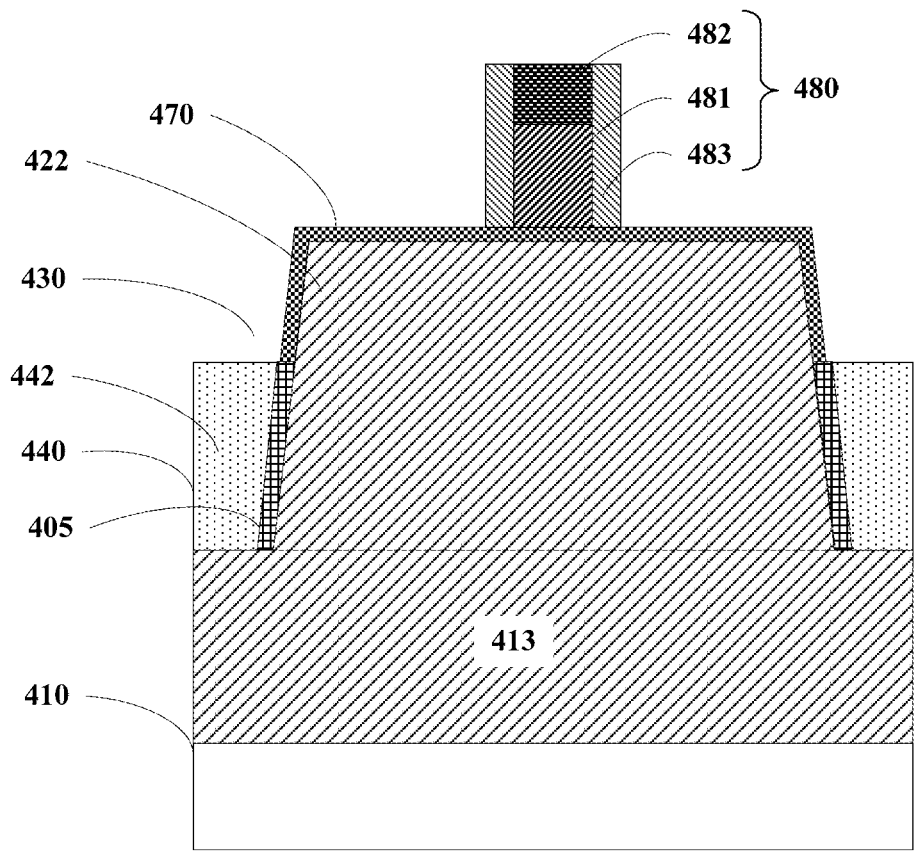
FIG. 12L

DIODE DESIGN OF FINFET DEVICE

CROSS-REFERENCES TO RELATED APPLICATIONS

The present application claims priority to Chinese patent application No. 201610622768.1, filed with the State Intellectual Property Office of People's Republic of China on Aug. 2, 2016, the content of which is incorporated herein by reference in its entirety.

FIELD OF THE INVENTION

The present invention relates to integrated semiconductor devices, and more particularly to an electrostatic discharge protection device, a semiconductor device having an electrostatic discharge protection structure and manufacturing methods thereof.

BACKGROUND OF THE INVENTION

With the continuous miniaturization of metal oxide semiconductor field effect transistor (MOSFET) devices, the short channel effect becomes a critical issue. Fin-type field effect transistor (FinFET) devices with better gate control capability for channel charge can further reduce the size of CMOS devices.

Electrostatic discharge protection is important against excessive voltages in FinFET devices. A pn junction is formed on the fin in a conventional ESD protection device. Since the fin is relatively narrow, a discharge current of the ESD protection device flows through a relatively small cross-sectional area of the relatively narrow fin. The limited area can easily result in local hot spots, thereby reducing the performance of the ESD device.

BRIEF SUMMARY OF THE INVENTION

The present inventor has discovered the above-described problems and provide solutions to overcome the drawbacks of the prior art. An object of the invention is the provision of an ESD protection device to solve the above prior-art problems. A further object of the invention is to provide a semiconductor device having an ESD protection device. Another object of the invention is to provide methods for manufacturing the ESD protection device and the semiconductor device.

According to the invention, a method for manufacturing an electrostatic discharge (ESD) protection device may include providing a semiconductor structure including a semiconductor substrate having a first region of a first conductivity type and a semiconductor fin on the semiconductor substrate; forming an electrode on the semiconductor fin; and performing a doping process on the semiconductor structure to forming a second region in the first region, the second region having a second conductivity type opposite the first conductivity type to form a pn junction in the semiconductor substrate. Since the pn junction is formed in the semiconductor substrate, it has a relatively large area to prevent local hot spots from occurring when a current flows through the ESD protection device, thereby reducing performance degradation of a semiconductor device.

In one embodiment, the second region has a doping concentration greater than a doping concentration of the first region.

In one embodiment, prior to performing the doping process, the semiconductor fin is on the first region, and after performing the doping process, the semiconductor fin is on the second region.

In one embodiment, the first conductivity type is P-type, and the second conductivity type is N-type. In another embodiment, the first conductivity type is N-type, and the second conductivity type is P-type.

In one embodiment, the method further includes forming a trench around the semiconductor fin; and forming a first insulator layer partially filling the trench, wherein the electrode is formed on the first insulator layer.

In one embodiment, forming the electrode comprises performing an etch process on the semiconductor fin to form a recess; and epitaxially grown an in-situ doped electrode in the recess.

In one embodiment, performing the doping process comprises an ion implantation process; the first conductivity type is P-type, and the second conductivity type is N-type, the ion implantation process includes implanting arsenic ions or phosphorous ions into the semiconductor structure, with a dose in a range between $1.0 \times 10^{14}$ atoms/cm$^2$ and $1.0 \times 10^{16}$ atoms/cm$_2$, and an energy in a range between 2 keV and 30 keV. Alternatively, the first conductivity type is N-type, and the second conductivity type is P-type, the ion implantation process includes boron ions or boron fluoride ions, with a dose in a range between $1.0 \times 10^{14}$ atoms/cm$^2$ and $1.0 \times 10^{16}$ atoms/cm$^2$, and an energy in a range between 1 keV and 15 keV.

In one embodiment, the method further includes submitting the semiconductor structure to an annealing treatment after performing the doping process.

In one embodiment, performing the doping process includes doping the semiconductor fin to have the second conductivity type.

According to the invention, a method for manufacturing a semiconductor device may include providing a semiconductor structure comprising a semiconductor substrate including a first region of a first conductivity type, a first semiconductor fin and a second semiconductor fin on the semiconductor substrate and separated from each, a trench around the first and second semiconductor fins, a first insulator layer partially filling the trench, and the first insulator layer comprising a first portion around the first semiconductor fin and a second portion around the second semiconductor fin. The method may also include performing an etch process on the first portion of the first insulator layer such that an upper surface of the first portion of the first insulator layer is lower than an upper surface of the second portion of the first insulator layer; forming an electrode on the first semiconductor fin; forming a source and a drain on the second semiconductor fin; and performing a doping process into the semiconductor substrate having the formed electrode, the source and drain to form a second region in the first region, the second region being of a second conductivity type opposite the first conductivity type to form a pn junction in the semiconductor substrate.

In one embodiment, the first semiconductor fin is used for forming an electrostatic (ESD) protection device; and the second semiconductor fin is used for forming a metal-oxide-semiconductor (MOS) device.

In one embodiment, performing the doping process comprises an ion implantation process; the first conductivity type is P-type, and the second conductivity type is N-type, the ion implantation process comprising arsenic ions or phosphorous ions, with a dose in a range between $1.0 \times 10^{14}$ atoms/cm$^2$ and $1.0 \times 10^{16}$ atoms/cm$^2$, and an energy in a range between 2 keV and 30 keV. Alternatively, the first conductivity type is N-type, and the second conductivity type is P-type, the ion implantation process includes implanting boron ions or boron fluoride ions with a dose in a range between $1.0 \times 10^{14}$ atoms/cm$^2$ and $1.0 \times 10^{16}$ atoms/cm$^2$ and an energy in a range between 1 keV and 15 keV.

In one embodiment, performing the etch process on the first portion of the first insulator layer includes forming a patterned first mask layer on the second portion of the first insulator layer covering the second semiconductor fin while exposing the first portion; etching the exposed first portion using the patterned first mask layer as a mask; and removing the first mask layer.

In one embodiment, performing the doping process includes forming a patterned second mask layer on the second portion of the first insulator layer covering the second semiconductor fin and exposing the etched first portion; performing the doping process into the semiconductor substrate using the second mask layer as a mask such that the second region has the second conductivity type; and removing the second mask layer.

In one embodiment, the electrode has a volume that is greater than a volume of the source, and the electrode has a volume that is greater than a volume of the drain.

In one embodiment, the method may further include submitting the semiconductor structure to an annealing treatment after performing the doping process.

In one embodiment, the semiconductor structure further includes a second insulator layer overlying a portion of a surface of the first semiconductor fin and a portion of a surface of the second semiconductor fin, wherein performing the etch process on the first portion of the first insulator layer further comprises removing a second insulator layer on the first semiconductor fin.

In one embodiment, the method further includes forming a third insulator layer on the semiconductor substrate; performing a doping process into the semiconductor substrate to form a first region in the semiconductor substrate; forming a patterned first hardmask layer on the third insulator layer; performing an etch process on the third insulator layer and the semiconductor substrate using the patterned first hardmask layer as a mask to form the first semiconductor fin and the second semiconductor fin having a trench around them; forming the first insulator layer partially filling the trench; removing the first hardmask layer and the third insulator layer; performing a doping process into the second semiconductor fin for adjusting a threshold voltage thereof; forming a second insulator layer overlying a portion of a surface of the first semiconductor fin and a portion of a surface of the second semiconductor fin; and forming a dummy gate structure on the second semiconductor fin to form a MOS transistor. The dummy gate structure includes a dummy gate on a portion of the second insulator layer, a second hardmask layer on the dummy gate, and spacers on opposite sides of the dummy gate structure.

According to the invention, an electrostatic discharge (ESD) protection device includes a semiconductor substrate including a first region of a first conductivity type and a second region of a second conductivity type opposite the first conductivity type, the first region and the second region being adjacent to each other and forming a pn junction in the semiconductor substrate; a semiconductor fin on the semiconductor substrate; and an electrode on the semiconductor fin.

In one embodiment, the second region has a doping concentration greater than a doping concentration of the first region. In one embodiment, the semiconductor fin is on the second region.

In one embodiment, the first conductivity type is P-type, and the second conductivity type is N-type. In another embodiment, the first conductivity type is N-type, and the second conductivity type is P-type.

In one embodiment, the ESD protection device further includes a trench formed around the semiconductor fin; a first insulator layer partially filled the trench, wherein the electrode is formed on the first insulator layer.

In one embodiment, the semiconductor fin is of the second conductivity type.

According to the invention, a semiconductor device includes a semiconductor substrate including a first region of a first conductivity type and a second region of a second conductivity type opposite the first conductivity type, the first region and the second region being adjacent to each other and forming a pn junction in the semiconductor substrate; a first semiconductor fin and a second semiconductor fin on the semiconductor substrate, the first and second semiconductor fins being separated from each other, a trench formed around the first and second semiconductor fins; a first insulator layer partially filled the trench, the first insulator layer including a first portion around the first semiconductor fin and a second portion around the second semiconductor fin, the first portion having an upper surface lower than an upper surface of the second portion; an electrode on the first semiconductor fin; and a source and a drain on the second semiconductor fin.

In one embodiment, the second region has a doping concentration greater than a doping concentration of the first region.

In one embodiment, the first semiconductor fin is on the second region.

In one embodiment, the first conductivity type is P-type, and the second conductivity type is N-type. In another embodiment, the first conductivity type is N-type, and the second conductivity type is P-type.

In one embodiment, the first semiconductor fin is used for forming an electrostatic (ESD) protection device; and the second semiconductor fin is used for forming a metal-oxide-semiconductor (MOS) device. In one embodiment, the electrode has a volume that is greater than a volume of the source, and the electrode has a volume that is greater than a volume of the drain.

In one embodiment, the semiconductor further includes a second insulator layer overlying a portion of a surface of the second semiconductor fin.

In one embodiment, the semiconductor device further includes a dummy gate structure on the second semiconductor fin for forming a MOS transistor, the dummy gate structure comprising a dummy gate on a portion of the second insulator layer, a second hardmask layer on the dummy gate, and spacers on opposite sides of the dummy gate structure, wherein the source and the drain are disposed on opposite sides of the dummy gate structure.

The following description, together with the accompanying drawings, will provide a better understanding of the nature and advantages of the claimed invention.

BRIEF DESCRIPTION OF THE DRAWINGS

The accompanying drawings, which are included to provide a further understanding of the invention and are incorporated in and constitute a part of this application, illustrate certain embodiments of the invention. In the drawings:

FIGS. 2A, 2B1, 2B2, 2C1, 2C2, 2D and 2E are cross-sectional views of intermediate stages of a method for manufacturing an ESD protection device according to an embodiment of the present invention.

FIG. 3 is a flowchart of a method for manufacturing a semiconductor device according to an embodiment of the present invention FIGS. 4A through 4C, 5A-5B, 6A through 6C, 7A through 7C, 8A-8B, and 9 through 11 are cross-sectional views of intermediate stages of a method for manufacturing a semiconductor device according to an embodiment of the present invention.

FIGS. 12A through 12J, 12K1 through 12K3, and 12L are cross-sectional views of intermediate stages of a method for manufacturing a semiconductor device according to an embodiment of the present invention.

DETAILED DESCRIPTION OF THE INVENTION

Figure 1:
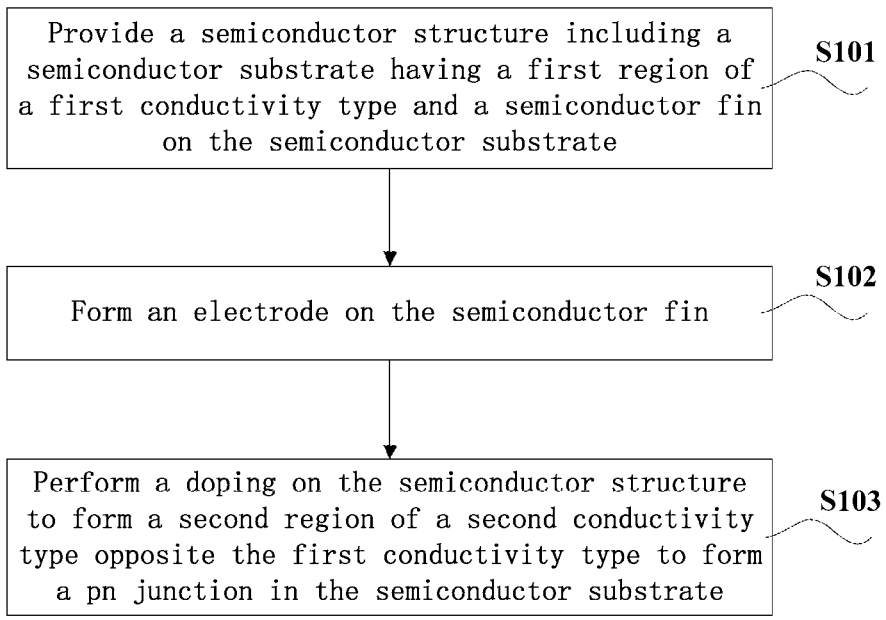
FIG. 1 is a flowchart of a method for manufacturing an electrostatic discharge protection device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a flowchart of a method for manufacturing an ESD protection device according to an embodiment of the present invention. FIGS. 2A, 2B1, 2B2, 2C1, 2C2, 2D and 2E are cross-sectional views of intermediate stages of a method for manufacturing an ESD protection device according to an embodiment of the present invention.

Referring to FIG. 1, the method includes:

Step S101: provide a semiconductor structure including a semiconductor substrate having a first region of a first conductivity type and a semiconductor fin on the semiconductor substrate.

Figure 2A:
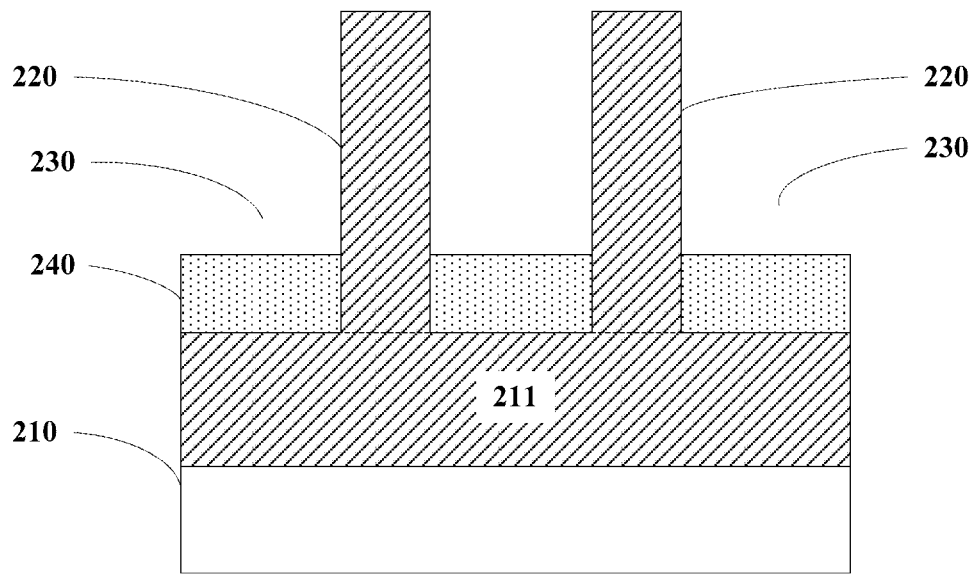

FIG. 2A is a cross-sectional view illustrating a semiconductor structure in S101. As shown in FIG. 2A, the semiconductor structure may include a semiconductor substrate 210 (e.g., a silicon substrate) including a first region 211 of a first conductivity type and a semiconductor fin (e.g., a silicon fin) 220 on semiconductor substrate 210. In one embodiment, semiconductor fin 220 is disposed on first region 211.

In one embodiment, the semiconductor structure may also include a trench 230 formed around (surrounding) semiconductor fin 220. The semiconductor structure may also include a first insulator layer 240 partially filling trench 230. For example, the first insulator layer may include silicon oxide.

It is noted that, in the drawings of the embodiments of the present invention, the dashes lines may be used to distinguish different regions or structures, but they are not necessarily a real physical line.

Referring back to FIG. 1, at S102, an electrode is formed on the semiconductor fin.

FIG. 2C1 is a cross-sectional view illustrating a semiconductor structure in S102. FIG. 2C2 is a cross sectional view illustrating the semiconductor structure in FIG. 2C1 taken along the line C-C'. As shown in FIGS. 2C1 and 2C2, an electrode 260 is formed on semiconductor fin 220. For example, the electrode may include silicon germanium (SiGe) or silicon phosphide (SiP). In one embodiment, electrode 260 is formed on first insulator layer 240. In one embodiment, an in-situ doping process may also be performed into the electrode during the formation of the electrode to obtain a doped electrode.

FIG. 2B1 is a cross-sectional view illustrating a structure having a recess in the semiconductor fin according to an embodiment of the present invention. FIG. 2B2 is a cross sectional view illustrating the semiconductor structure in FIG. 2B1 taken along the line A-A'. FIG. 2B1 is a cross sectional view illustrating the semiconductor structure in FIG. 2B2 taken along the line B-B'. The process of forming an electrode on a semiconductor fin (i.e., step S102) according to one embodiment of the present invention is described in detail below with reference to FIGS. 2B1, 2B2, 2C1, and 2C2.

In one embodiment, step S102 may also include etching semiconductor fin 220 to form recess 250 in the semiconductor fin, as shown in FIGS. 2B1 and 2B2.

In one embodiment, step S102 may further include epitaxially growing electrode 260 which is in-situ doped, as shown in FIGS. 2C1 and 2C2.

It is understood that the number of electrodes on the semiconductor fin can be any integer number N. In the example shown in FIGS. 2C1 and 2C2, one electrode is shown to be formed on each one of the semiconductor fins, but it is understood that the number is arbitrary chosen for describing the example embodiment and should not be limiting. The number N may be more than one, e.g., two or three or even more, the present invention is not limited thereto.

Referring back to FIG. 1, at S103, a doping process is performed on the semiconductor structure having the electrode formed thereon to form a second region in the first region, the second region is of a second conductivity type opposite the first conductivity type to form a pn junction in the semiconductor substrate.

Figure 2D:
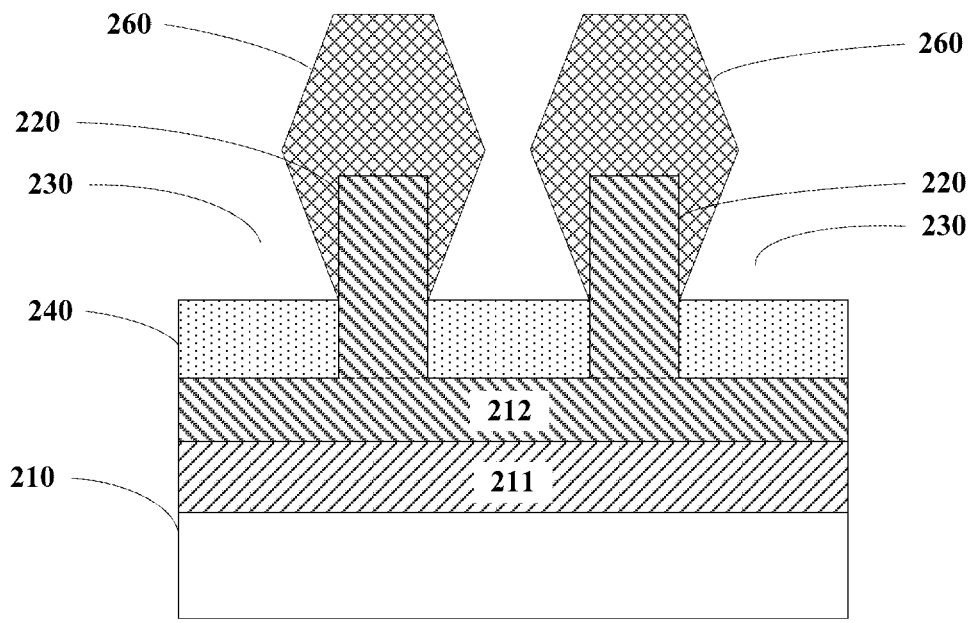

FIG. 2D is a cross-sectional view illustrating a semiconductor structure in S103. As shown in FIG. 2D, a doping process is performed on the semiconductor structure after the electrode has been formed thereon to form a second region 212 of a second conductivity type in first region 211 of the first conductivity type that is opposite to the second conductivity type to form a pn junction in semiconductor substrate 210. In another embodiment, the first conductivity type is N-type, and the second conductivity type is P-type. In one embodiment, the doping concentration of second region 212 is greater than the doping concentration of first region 211.

In one embodiment, prior to performing the doping process, semiconductor fin 220 is disposed on first region 211. After the doping process has been performed, semiconductor fin 220 is disposed on second region 212. In one embodiment, as shown in FIG. 2D, the doping process causes semiconductor fin 220 to have the second conductivity type.

In one embodiment, doping may be performed using an ion implantation process. In one example embodiment, the first conductivity type is P-type, the second conductivity type is N-type, performing the ion implantation process may include implanting arsenic ions or phosphorous ions into the semiconductor structure, with the implantation dose in the range between $1.0\times10^{14}$ atoms/cm$^2$ and $1.0\times10^{16}$ atoms/cm$^2$, and the implantation energy in the range between 2 keV and 30 keV. In another example embodiment, the first conductivity type is N-type, the second conductivity type is P-type, performing the ion implantation process may include implanting boron ions or boron fluoride ions, with the implantation dose in the range between $1.0\times10^{14}$ atoms/cm$^2$ and $1.0\times10^{16}$ atoms/cm$^2$, the implantation energy in the range between 1 keV and 15 keV.

Thus, a method of manufacturing an ESD protection device has been provided by embodiments of the present invention.

In one embodiment, the above-described method may further include submitting the semiconductor structure to an annealing treatment after performing the doping process. The annealing treatment may be used to activate impurities (dopants) and may also be used to repair damage caused to the semiconductor fin or the semiconductor substrate in the doping process (e.g., by impacting ions).

Figure 2E:
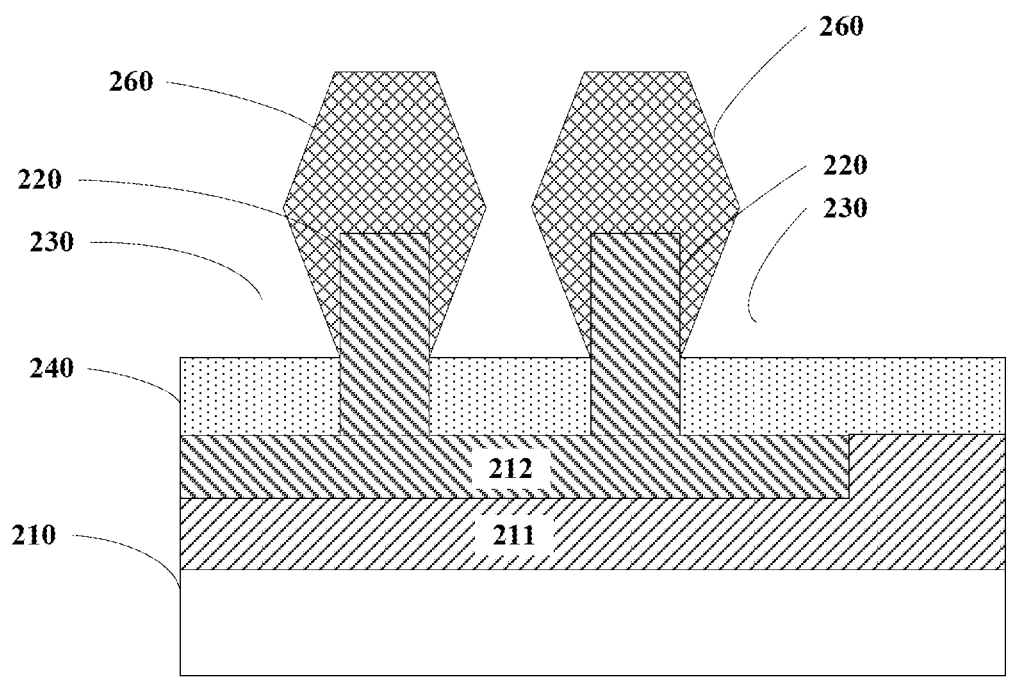

In some embodiments, the method may further include forming a body contact that is in contact with first region 211 and not in contact with second region 212. For example, as shown in FIG. 2E, second region 212 is disposed in first region 211, and a portion of first region 211 has an upper surface that is flush with the upper surface of second region 212. A body contact may be formed on this portion of first region 211 as a lead-out electrode (not shown in FIG. 2E) of the pn junction. One of skill in the art will appreciate that the body contact may be formed using contact forming techniques known in the art.

Embodiments of the present invention also provide an ESD protection device. Referring to FIG. 2D, the ESD protection device may include a semiconductor substrate 210 having a first region 211 and a second region 212 adjacent to first region 211. First region 211 is of a first conductivity type, and second region 212 is of a second conductivity type opposite the first conductivity type. First region 211 and second region 212 form a pn junction disposed in semiconductor substrate 210. In one embodiment, the first conductivity type is P-type, and the second conductivity type is N-type. In another embodiment, the first conductivity type is N-type, and the second conductivity type is P-type. In one embodiment, the doping concentration of second region 212 is greater than the doping concentration of first region 211.

Referring still to FIG. 2D, the ESD protection device may also include a semiconductor fin 220 on semiconductor substrate 210. In one embodiment, semiconductor fin 220 is on second region 212. In one embodiment, semiconductor fin 220 is of the second conductivity type.

Referring still to FIG. 2D, the ESD protection device may further include an electrode 260 on semiconductor fin 220. In one example embodiment, the electrode may be an in-situ doped electrode.

In one embodiment, the ESD protection device may further include a trench 230 surrounding semiconductor fin 220. In one embodiment, the ESD protection device may further include a first insulator layer 240 partially filling trench 230. Electrode 260 is disposed on first insulator layer 240.

Because the pn junction is formed in the semiconductor substrate in the ESD protection device according to embodiments of the present invention, the pn junction area is relatively large. When a current flows through the ESD protection device, the current will flow through a relatively large area in the semiconductor substrate, so that it is less likely to develop local hot spots, thus the risk of degradation of the device performance can be reduced or even prevented.

FIG. 3 is a flow chart of a method of manufacturing a semiconductor device according to an embodiment of the present invention. FIGS. 4A through 4C, 5A-5B, 6A through 6C, 7A through 7C, 8A-8B, and 9 through 11 are cross-sectional views of intermediate stages of a method for manufacturing a semiconductor device according to an embodiment of the present invention.

Referring to FIG. 3, the method includes:

Step S301: provide a semiconductor structure including a semiconductor substrate having a first region of a first conductivity type and a fin semiconductor fin and a second semiconductor fin on the semiconductor substrate. The first and second semiconductor fins are spaced apart from each other. The semiconductor substrate also includes a trench around the first semiconductor fin and the second semiconductor fin. The semiconductor substrate also includes a first insulator layer that partially fills the trench and has a first portion around the first semiconductor fin and a second portion around the second semiconductor fin.

Figure 4B:
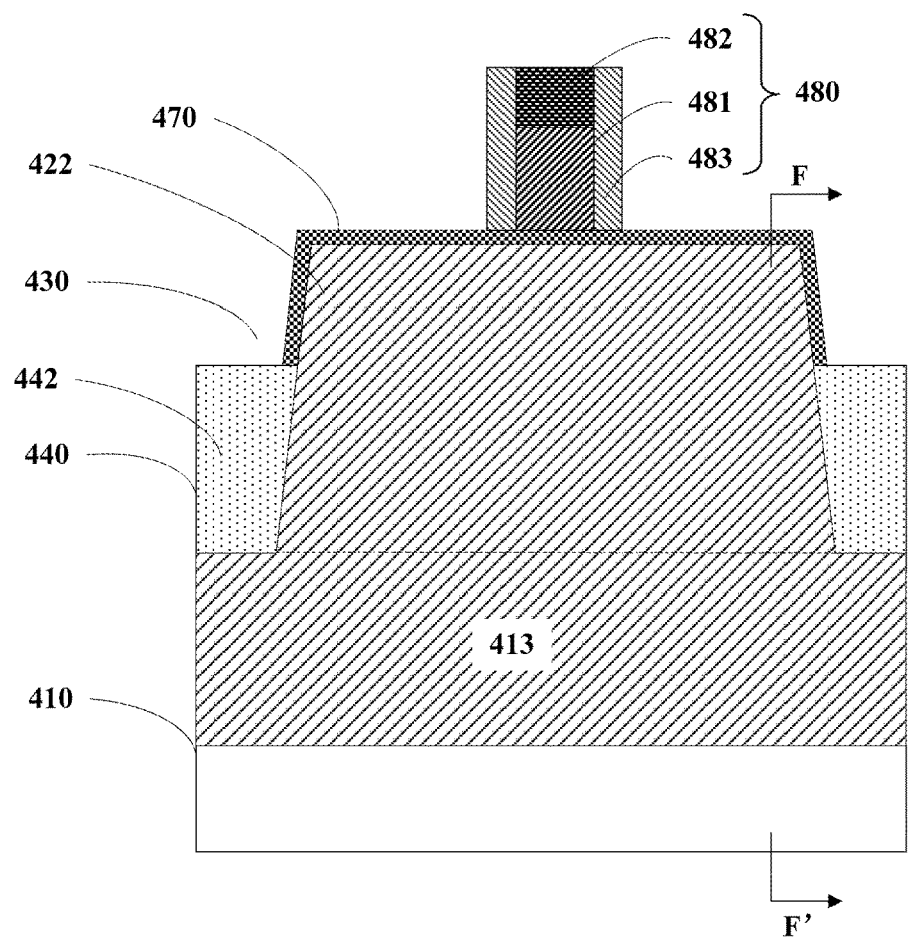
Figure 4C:
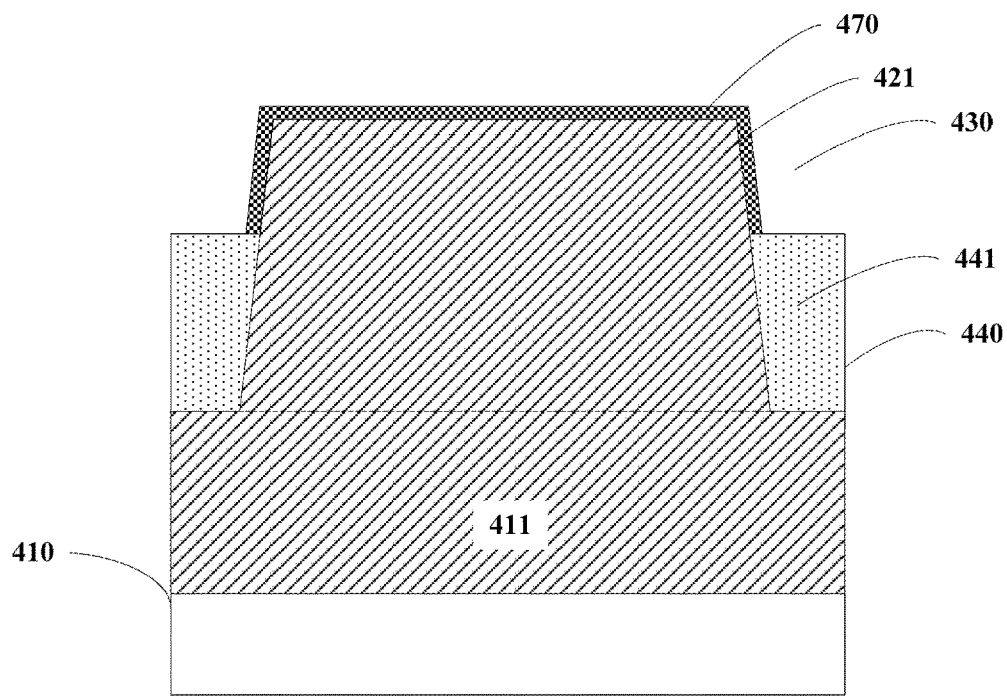

FIG. 4A is a cross-sectional view illustrating a semiconductor structure in S301. FIG. 4B is a cross-sectional view illustrating the semiconductor structure in FIG. 4A taken along the line D-D'. FIG. 4C is a cross-sectional view illustrating the semiconductor structure in FIG. 4A taken along the line E-E'. FIG. 4A is a cross-sectional view illustrating the semiconductor structure in FIG. 4B taken along the line F-F'. As shown in FIGS. 4A, 4B, and 4C, the semiconductor structure may include a semiconductor substrate 410 having a first region 411 of a first conductivity type on semiconductor substrate (e.g., silicon substrate) 410 and a first semiconductor fin (e.g., silicon fin) 421 and a second semiconductor fin (e.g., silicon fin) 422 on the semiconductor substrate. The first and second semiconductor fins are spaced apart from each other. Semiconductor substrate 410 also includes a trench 430 around first semiconductor fin 421 and second semiconductor fin 422. The semiconductor substrate also includes a first insulator layer (e.g., silicon dioxide) 440. First insulator layer 440 partially fills trench 430 and has a first portion 441 around first semiconductor fin 421 and a second portion 442 around second semiconductor fin 422. The process of providing the semiconductor structure will be described in detail later below.

In one embodiment, semiconductor substrate 410 may also include a third region 413 adjacent to first region 411. Third region 413 may have a same conductivity type as that of first region 411, or third region 413 may have a conductivity type that is different from that of first region 411. In the following description, an embodiment of the present invention will be used with third region 413 having the same conductivity type as that of first region 411.

In one embodiment, referring to FIGS. 4A and 4C, first semiconductor fin 421 is on first region 411. In one embodiment, referring to FIGS. 4A and 4B, second semiconductor fin 422 is on third region 413.

In one embodiment, referring to FIG. 4A, the semiconductor structure may also include a second insulator layer 470 covering a portion of a surface of first semiconductor fin 421 and a portion of a surface of second semiconductor fin 422. For example, second insulator layer 470 may include silicon oxide.

In one embodiment, first semiconductor fin 421 may be used to form an ESD protection device, and second semiconductor fin 422 may be used to form a metal oxide semiconductor (MOS) transistor.

In one embodiment, referring to FIG. 4B, the semiconductor structure may also include a dummy gate structure 480 on second semiconductor fin 422 for forming a MOS transistor. Dummy gate structure 480 may include a dummy gate 481 on a portion of second insulator layer 470, a hardmask layer 482 (referred to as the second hardmask layer in the process of forming the semiconductor structure described later below) on dummy gate 481, and spacers 483 on opposite sides of the dummy gate. Dummy gate 481 may include polysilicon. Hardmask layer 482 may include silicon nitride. Spacers 483 may include silicon nitride or silicon dioxide.

Referring back to FIG. 3, at S302, an etch process is performed on the first portion of the first insulator layer so that the first portion of the first insulator layer has an upper surface lower than the upper surface of the second portion of the first insulator layer.

Figure 5A:
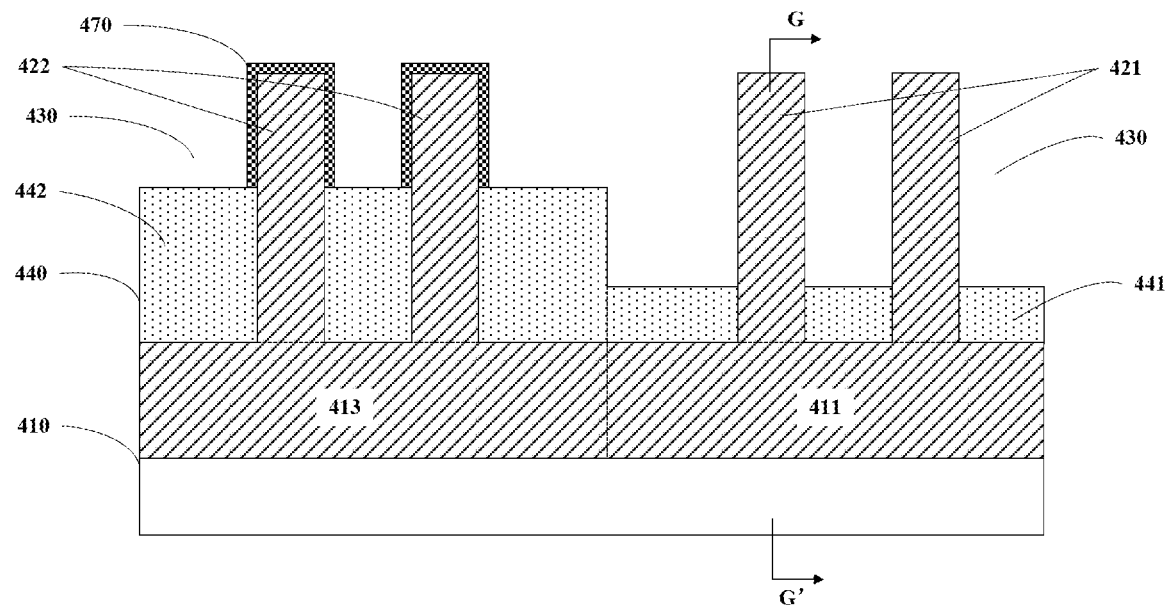
Figure 5B:
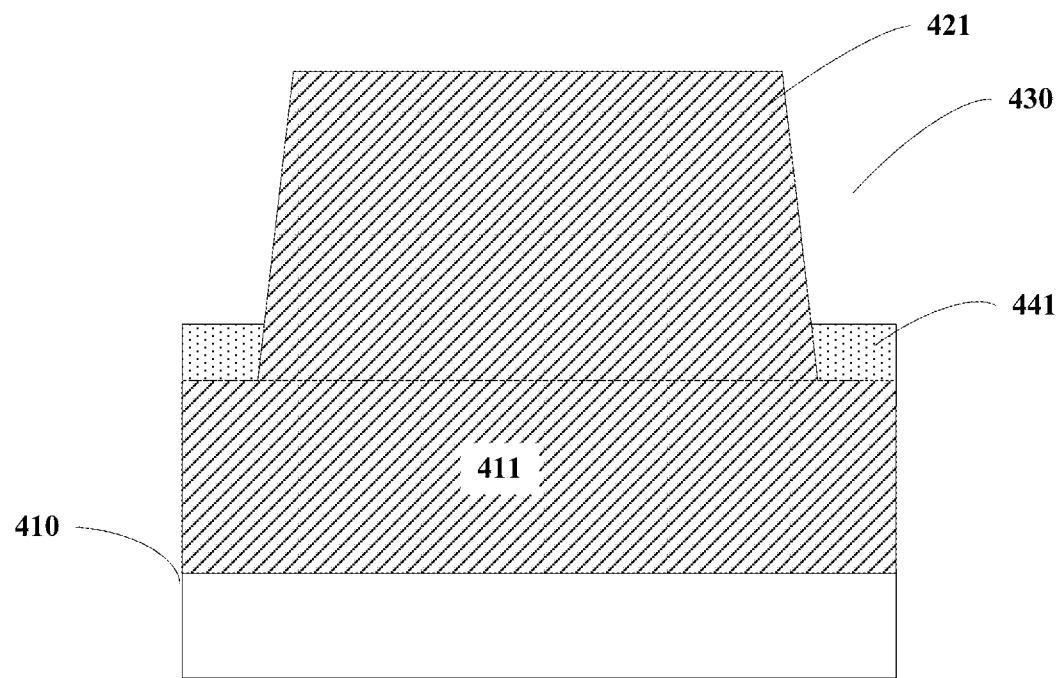

FIG. 5A is a cross-sectional view illustrating a semiconductor structure in S302. FIG. 5B is a cross-sectional view illustrating the semiconductor structure in FIG. 5A taken along the line G-G'. As shown in FIG. 5A, first portion 441 of first insulator layer 440 is etched so that the upper surface of first portion 441 is lower than the upper surface of second portion 442. In one embodiment, a remaining first portion 441 after etching has a thickness in the range between 30 Angstroms (Å) and 200 Å, e.g., 100 Å. In one embodiment, second portion 442 has a thickness in the range between 400 Å and 1000, e.g., 700 Å.

In one embodiment, referring to FIGS. 5A and 5B, in the process of etching the first portion of the first insulator layer, a portion of second insulator layer 470 covering first semiconductor fin 421 is also removed.

The process of etching the first portion of the first insulator layer (i.e., step S302) according to one embodiment will be described in detail with reference to FIGS. 5A, 10 and 11.

Figure 10:
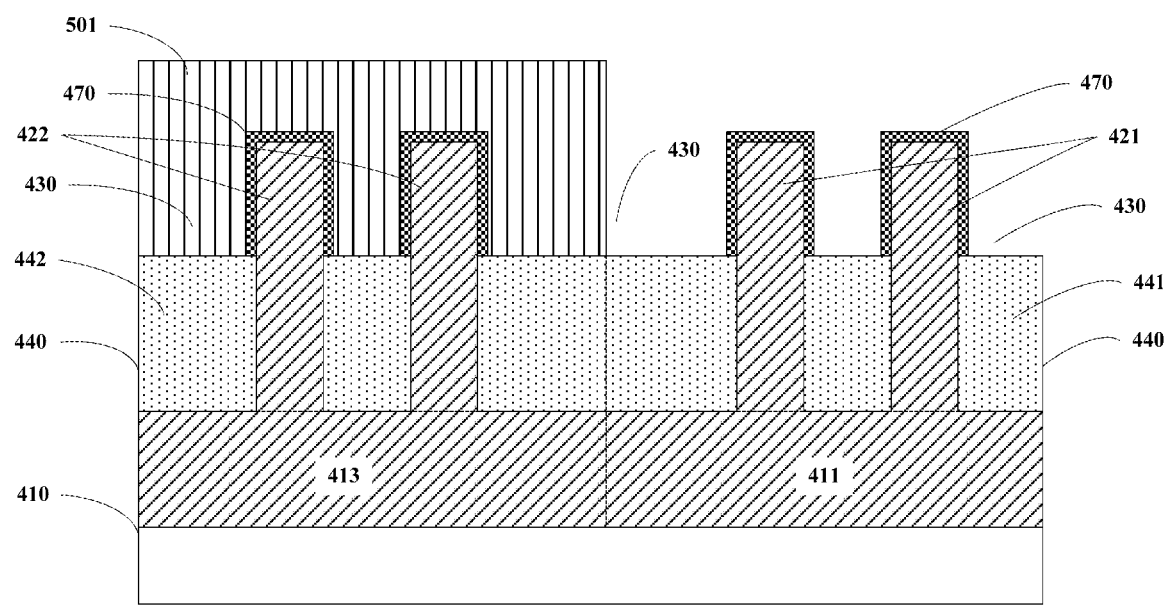

In one embodiment, referring to FIG. 10, step S302 may include forming a patterned first mask layer (e.g., photoresist) 501 on second portion 442. First mask layer 501 covers second semiconductor fin 422 and exposes first portion 411.

Figure 11:
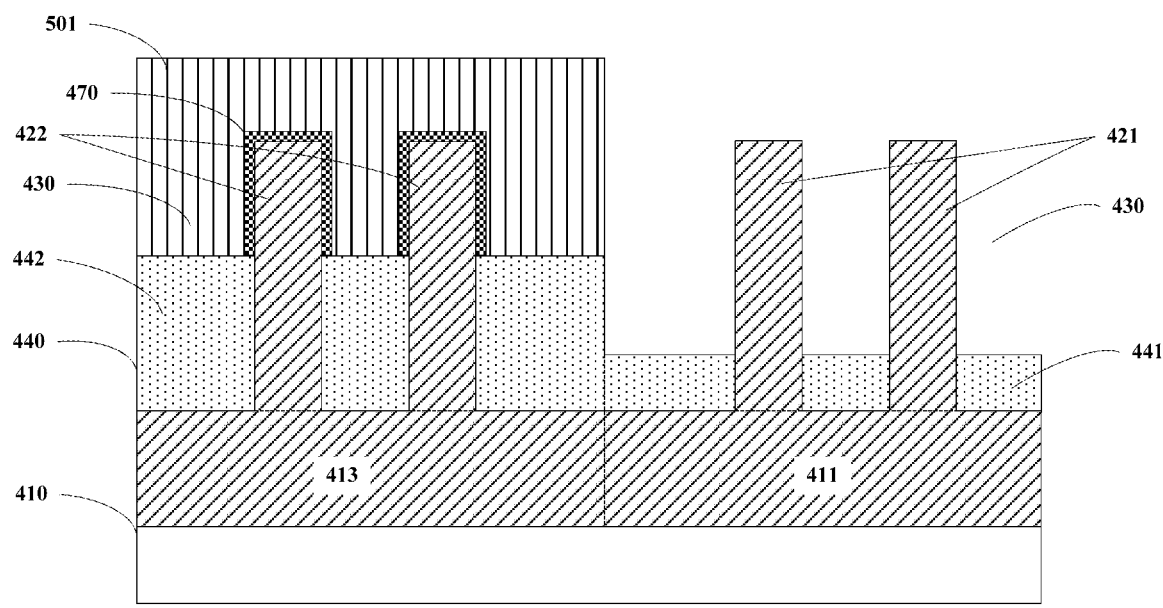

In one embodiment, referring to FIG. 11, step S302 may also include performing an etch process on exposed first portion 441 using first mask layer 501 as a mask. The etch process also removes the portion of second insulator layer 470 on first semiconductor fin 421.

In one embodiment, step S302 may also include removing the first mask layer to obtain the structure shown in FIG. 5A.

Referring back to FIG. 3, at S303, the method further includes forming an electrode on the first semiconductor fin and forming a source and a drain on the second semiconductor fin.

Figure 7A:
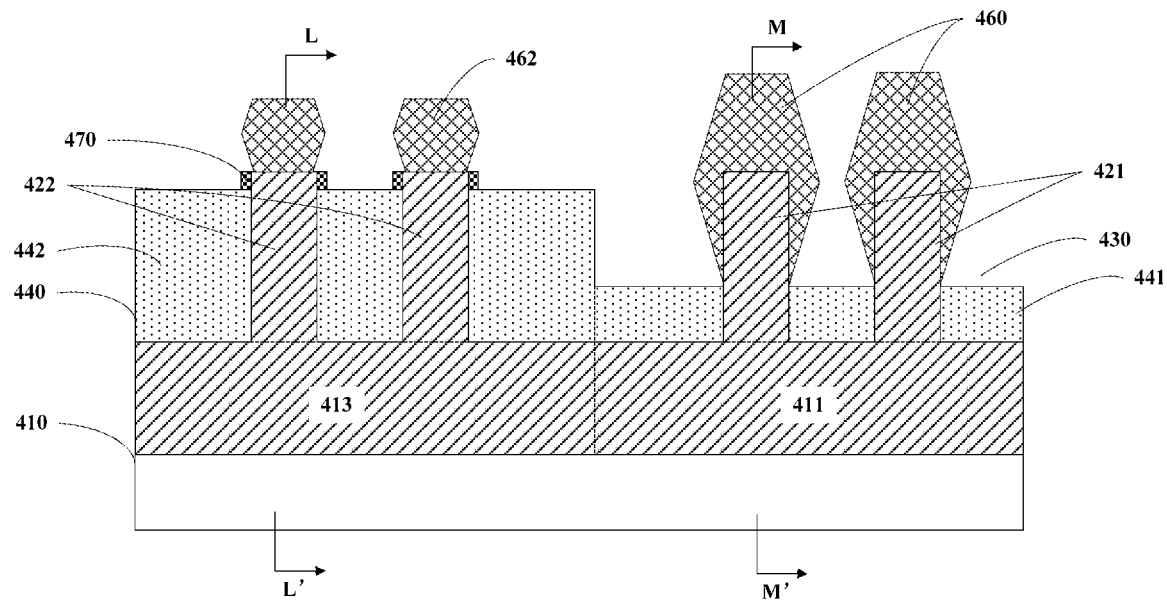
Figure 7B:
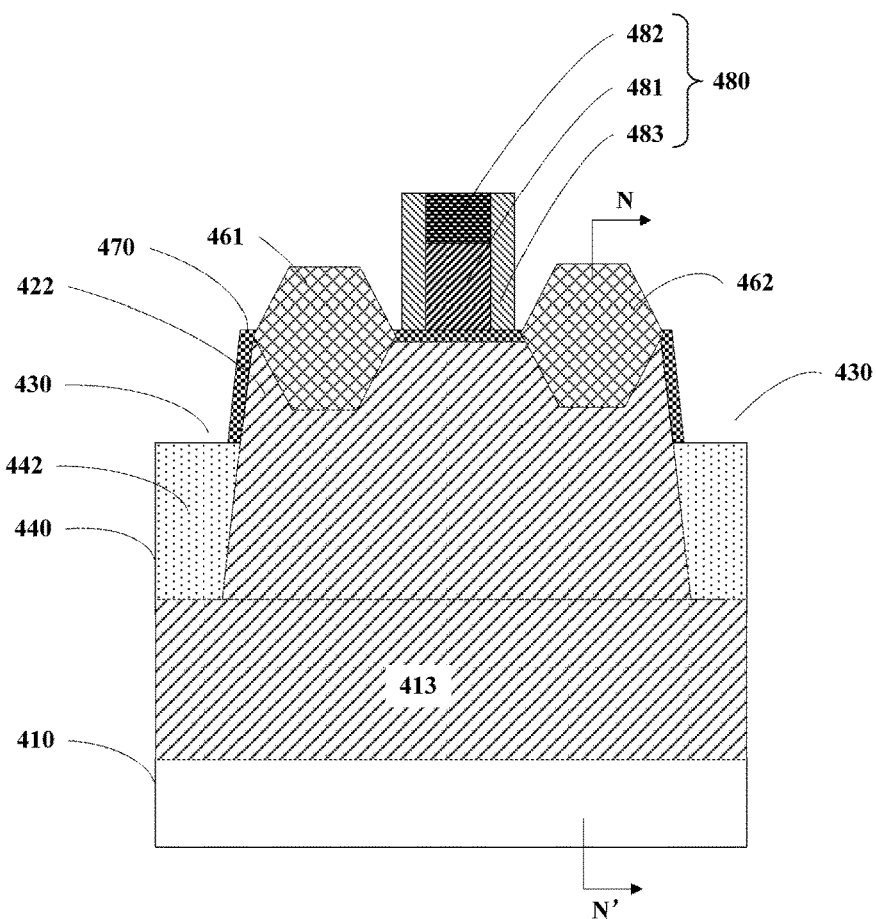
Figure 7C:
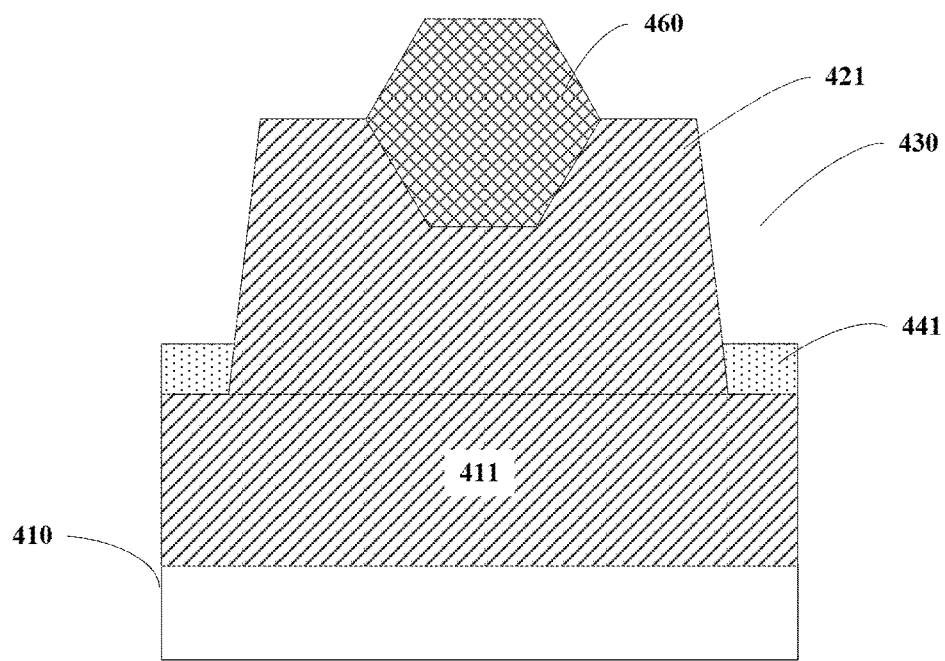

FIG. 7A is a cross-sectional view illustrating a semiconductor structure in S303. FIG. 7B is a cross-sectional view illustrating the semiconductor structure in FIG. 7A taken along the line L-L'. FIG. 7C is a cross-sectional view illustrating the semiconductor structure in FIG. 7A taken along the line M-M'. FIG. 7A is a cross-sectional view illustrating the semiconductor structure in FIG. 7B taken along the line N-N'. Referring to FIGS. 7A, 7B, and 7C, the semiconductor structure may include an electrode 460 formed on first semiconductor fin 421, a source 461 and a drain 462 formed on second semiconductor fin 422. In one embodiment, in step S303, electrode 460 has a volume that is larger than the volume of source 461, and the volume of electrode 460 is larger than the volume of drain 462. In one embodiment, source 461, drain 462, and electrode 460 each may include SiGe or SiP.

Figure 6A:
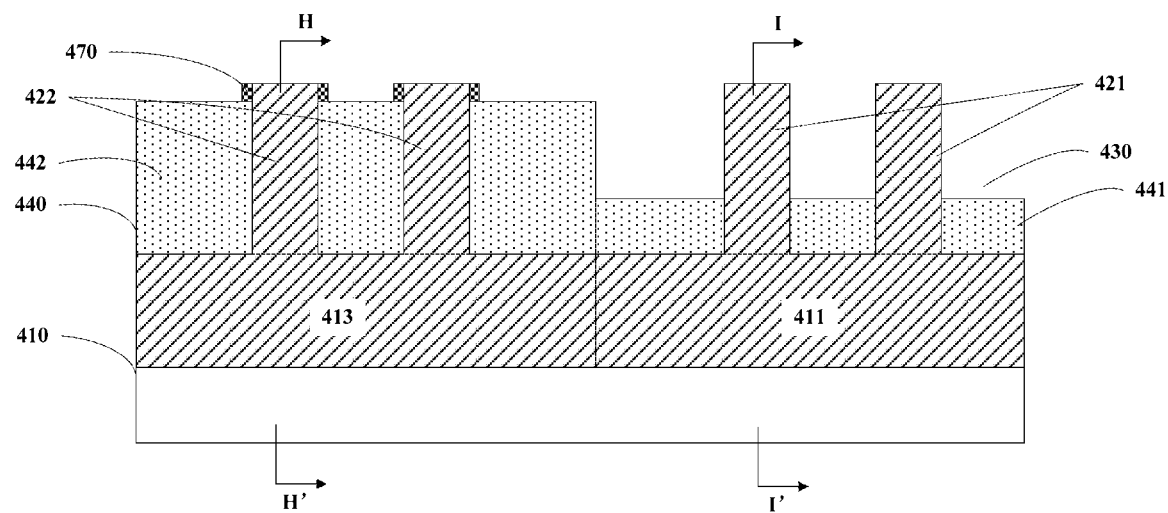
Figure 6B:
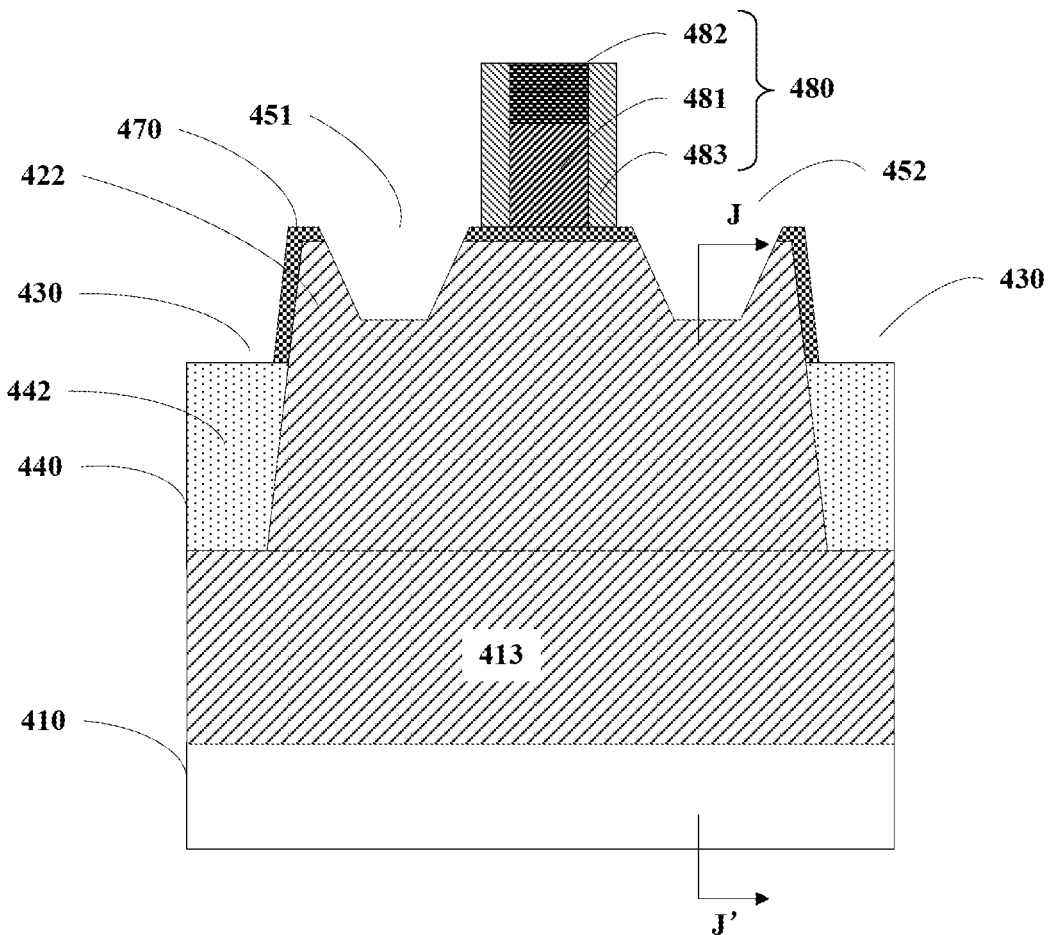
Figure 6C:
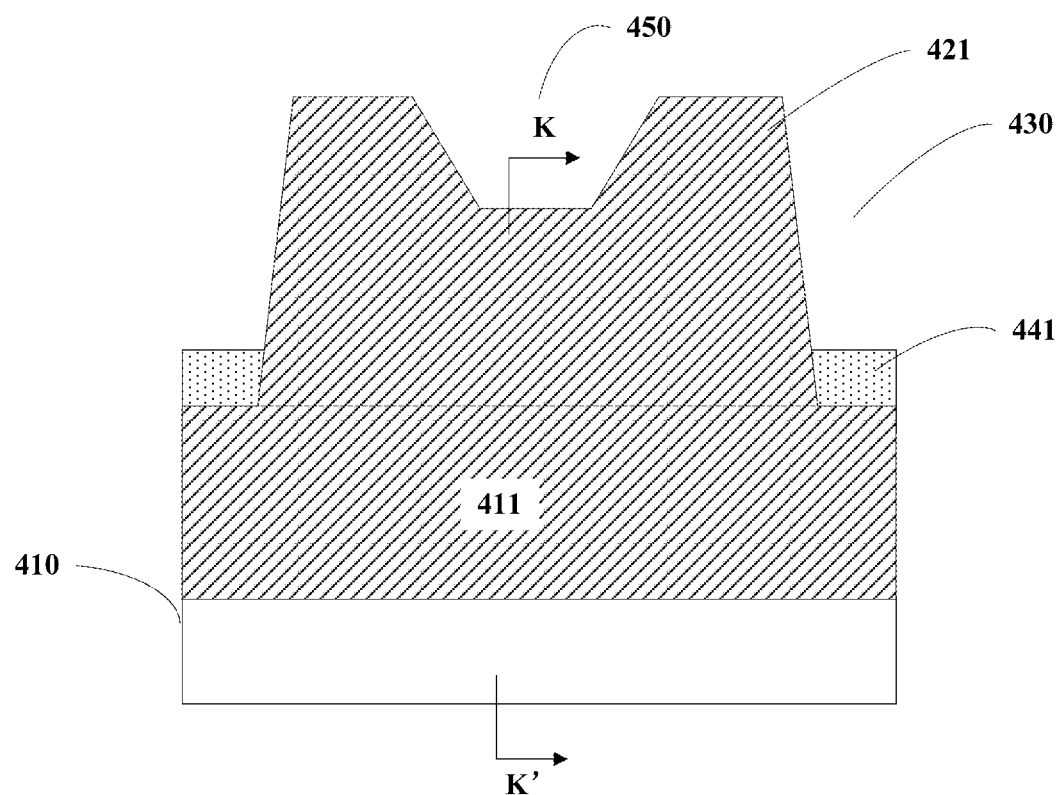

FIG. 6A is a cross-sectional view illustrating a semiconductor structure of forming a recess on a semiconductor fin. FIG. 6B is a cross-sectional view illustrating the semiconductor structure in FIG. 6A taken along the line H-H'. FIG. 6C is a cross-sectional view illustrating the semiconductor structure in FIG. 6A taken along the line I-I'. FIG. 6A is a cross-sectional view illustrating the semiconductor structure in FIG. 6B taken along the line J-J'. FIG. 6A is also a cross-sectional view illustrating the semiconductor structure in FIG. 6C taken along the line K-K'. The process in step S303 will be described in detail below with reference to FIGS. 6A to 6C and 7A to 7C according to one embodiment of the present invention.

In one embodiment, referring to FIGS. 6A through 6C, S303 may include performing an etch process on first semiconductor fin 421 and second semiconductor fin 422 to form a first recess 451 and a second recess 452 on second semiconductor fin 422 and a third recess 450 on first semiconductor fin 421.

In one embodiment, referring to FIGS. 7A, 7B, and 7C, S303 may also include epitaxially growing a source 461 in first recess 451, a drain 462 in second recess 452, and an electrode 460 in third recess 450. In an exemplary embodiment, source 461, drain 462, and electrode 460 each may be in-situ doped.

Referring back to FIG. 3, at S304, the method further includes performing a doping process on the semiconductor structure including the formed electrode, source and drain to form a second region in the first region, the second region having a second conductivity type that is opposite the first conductivity type to form a pn junction in the semiconductor substrate.

Figure 8A:
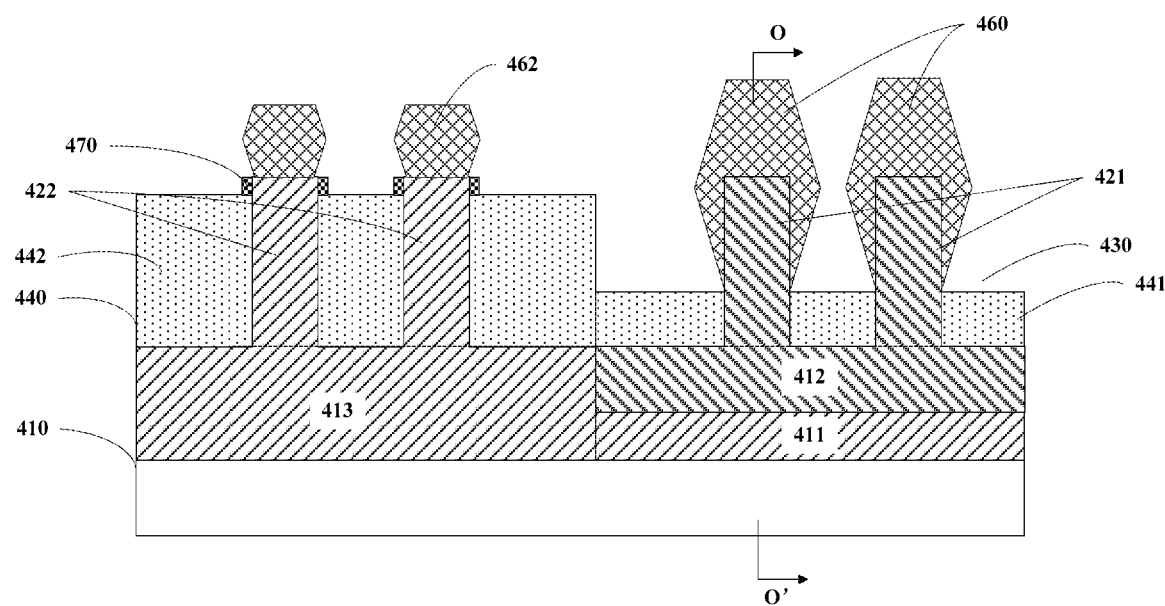
Figure 8B:
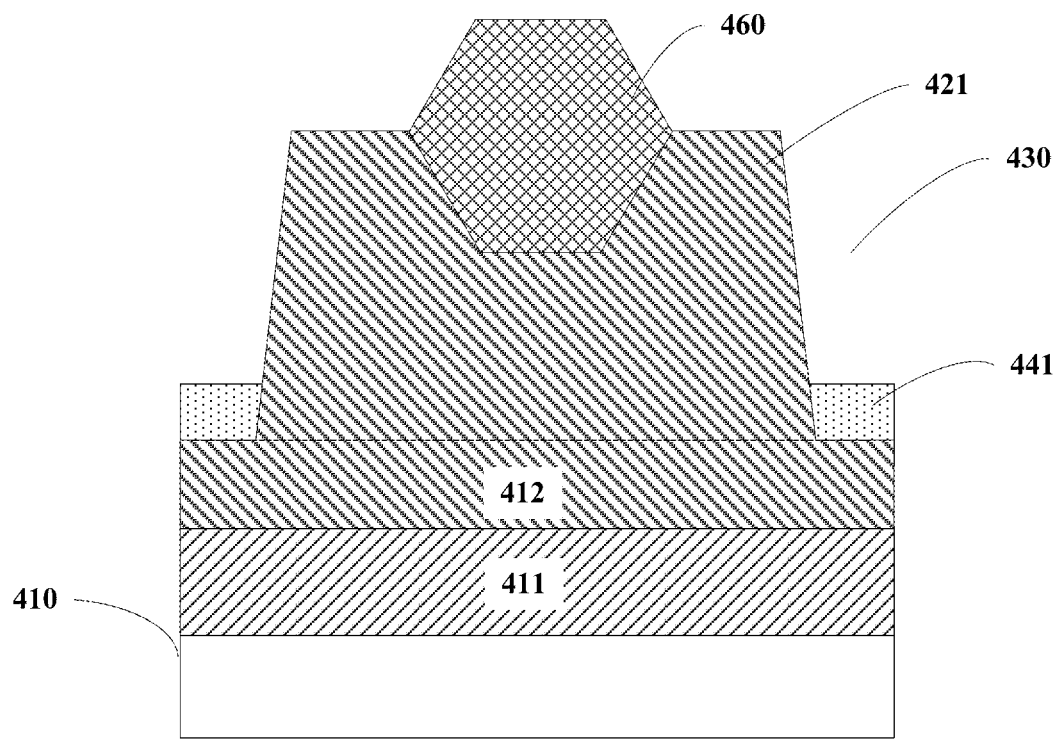
Figure 9:
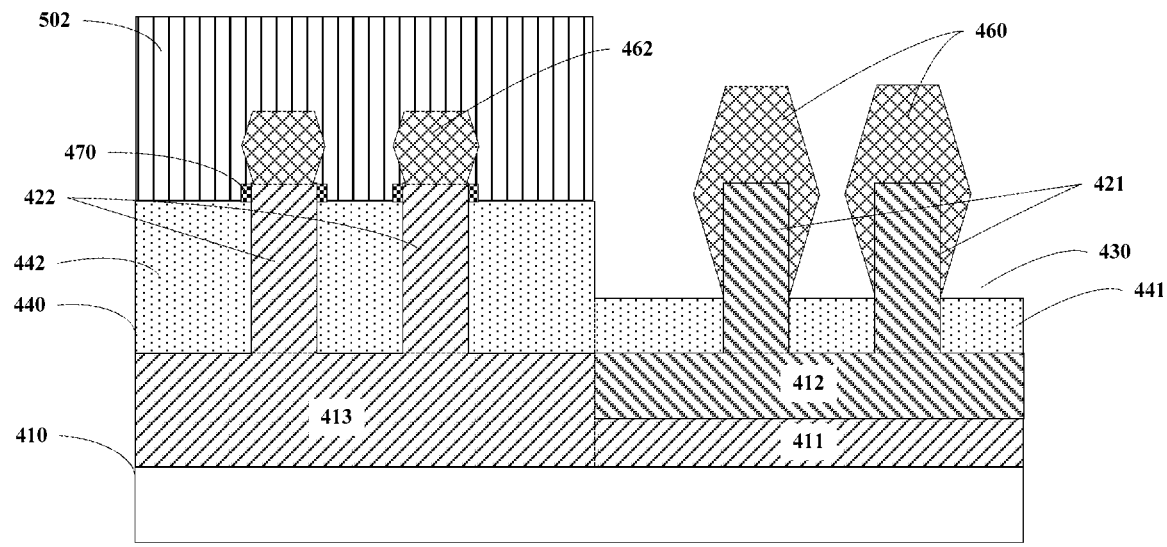

FIG. 8A is a cross-sectional view illustrating a semiconductor structure in S304. FIG. 8B is a cross-sectional view illustrating the semiconductor structure in FIG. 8A taken along the line O-O'. Referring to FIGS. 8A and 8B, a doping process (e.g., the doping may be referred to as a first dopant) is performed on the semiconductor structure including electrode 460, source electrode 461, and drain electrode 462 to form a second region 412 in first region 411. Second region 412 is of a second conductivity type that is opposite the first conductivity type to form a pn junction in semiconductor substrate 410. In one embodiment, the first conductivity type is P-type, and the second conductivity type is N-type. In another embodiment, the first conductivity type is N-type, and the second conductivity type is P-type.

In one embodiment, second region 412 has a doping concentration that is greater than the doping concentration of first region 411.

In one embodiment, prior to performing the doping process, first semiconductor fin 421 is on first region 411, and after the doping process has been performed, first semiconductor fin 421 is on second region 412. In one embodiment, as shown in FIG. 8A, the doping process may cause first semiconductor fin 421 to have the second conductivity type.

In one embodiment, the doping process may be performed using an ion implantation process. In one example embodiment, the first conductivity type is P-type, the second conductivity type is N-type, performing the ion implantation process may include implanting arsenic ions or phosphorous ions, with the implantation dose in the range between $1.0 \times 10^{14}$ atoms/cm$^2$ and $1.0 \times 10^{16}$ atoms/cm$^2$, the implantation energy in the range between 2 keV and 30 keV. In another example embodiment, the first conductivity type is N-type, the second conductivity type is P-type, performing the ion implantation process may include implanting boron ions or boron fluoride ions, with the implantation dose in the range between $1.0 \times 10^{14}$ atoms/cm$^2$ and $1.0 \times 10^{16}$ atoms/cm$^2$, and the implantation energy in the range between 1 keV and 15 keV.

In one embodiment, since first portion of first insulator layer 440 is thinned in the previous step, and second portion 442 is relatively thick, in the doping step, a region of opposite conductivity type is not formed in third region 413, so that a pn junction is not formed in the third region, so that the step of forming the MOS transistor will not be affected.

In one embodiment, the doping process in S304 may be performed in a different manner. For example, referring to FIG. 9, S304 may include forming a patterned second mask layer (e.g., photoresist) 502 on second portion 442. Second mask layer 502 covers second semiconductor fin 422 while exposing etched first portion 441. In one embodiment, still referring to FIG. 9, S304 may include performing a doping process on the semiconductor structure after second mask layer 502 has been formed using an ion implantation process to form second region 412 in first region 411, second region 412 having a second conductivity type opposite the first conductivity type. In one embodiment, S304 may further include removing second mask layer 502 to form the structure shown in FIG. 8A. In the embodiment, the second mask layer covers the second portion of the first insulator layer, the second semiconductor fin, and the dummy gate structure, the source and the drain on the second semiconductor fin, so that a formation of a pn junction in the third region can be more effectively prevented in the doping process.

Thus, embodiments of the present invention provide a method of manufacturing a semiconductor device.

In one embodiment, method 300 may also include subjecting the semiconductor device to annealing treatment.

Embodiment of the present invention also provide a semiconductor device. Referring to FIG. 8A, the semiconductor device may include a semiconductor substrate 410. Semiconductor substrate 410 includes a first region 411 and a second region 412 adjacent to first region 411. First region 411 is of a first conductivity type, and second region is of a second conductivity type opposite the first conductivity type. First region 411 and second region 412 form together a pn junction in semiconductor substrate 410. In one embodiment, the conductivity type is P-type, and the second conductivity type is N-type. In other embodiment, the conductivity type is N-type, and the second conductivity type is P-type. In one embodiment, second region 412 has a doping concentration greater than the doping concentration of first region 411.

In one embodiment, semiconductor substrate 410 may also include a third region 413 laterally adjacent to first region 411. Third region 413 and first region 411 may have the same conductivity type or different conductivity types.

Referring still to FIG. 8A, the semiconductor device may further include a first semiconductor fin 421 and a second semiconductor fin 422 that are separated from each other, and a trench 430 formed around first semiconductor fin 421 and second semiconductor fin 422. In one embodiment, first semiconductor fin 421 is disposed on second region 412. In one embodiment, second semiconductor fin 422 is disposed on third region 413.

In one embodiment, first semiconductor fin 421 may be used to form an ESD protection device, and second semiconductor fin 422 may be used to form a MOS protection device.

Referring still to FIG. 8A, the semiconductor device may further include a first insulator layer (e.g., silicon dioxide) 440 partially filling trench 430. First insulator layer 440 may include a first portion 441 disposed around first semiconductor fin 421, and a second portion 442 disposed around second semiconductor fin 422. First portion 441 has an upper surface which is lower than the upper surface of second portion 442. In one embodiment, first portion 441 has a thickness ranging from about 30 Å to about 200 Å, e.g., 100 Å. In one embodiment, second portion 442 has a thickness ranging from about 400 Å to about 1000 Å, e.g., 700 Å.

Referring still to FIG. 8A, the semiconductor device may further include an electrode 460 on first semiconductor fin 421, and a source 461 (not shown in FIG. 8A) and a drain 462 on second semiconductor fin 422. In one embodiment, electrode 460 has a volume that is larger than the volume of source 461, and the volume of electrode 460 is larger than the volume of drain 462.

In one embodiment, referring still to FIG. 8A, the semiconductor device may further include a second insulator (e.g., silicon dioxide) 470 overlying a portion of the surface of second semiconductor fin 422.

In one embodiment, the semiconductor device may further include a dummy gate structure 480 (shown in FIG. 7B) for forming a MOS transistor on second semiconductor fin 422. Dummy gate structure 480 may include a dummy gate 481 on a portion of second insulator layer 470, a hardmask layer 482 on dummy gate 481, and spacers 483 on opposite side surfaces of dummy gate structure 480. Source 461 and drain 462 are on opposite sides of dummy gate structure 480. Dummy gate 481 may include polysilicon. Hardmask layer 482 may include silicon nitride. Spacers 483 may include silicon nitride or silicon oxide.

The semiconductor device thus manufactured using the method of an embodiment of the present invention includes an ESD device, since the pn junction is formed in the semiconductor substrate, the pn junction has a large area. When a current flows through the ESD protection device, the current will flow through a relatively large area in the semiconductor substrate, so that local hot spots are less likely to be developed, it is thus possible to reduce or even prevent performance degradation of the semiconductor device.

The semiconductor device may further include a MOS transistor portion, and the first insulator layer filling the trench includes a relatively thin first portion and a relatively thick second portion. The relatively thin first portion is formed around the semiconductor fin of the ESD protection device, the relatively thick second portion is formed around the semiconductor fin of the MOS device, such that, when a doping process is performed on the ESD protection device to form the second region, the portion of the MOS transistor substrate will does not be affected, and no pn junction will be formed in the portion of the MOS transistor substrate.

FIGS. 12A through 12J, 12K1 through 12K3, and 12L are cross-sectional views of intermediate stages of a method for manufacturing a semiconductor device according to an embodiment of the present invention.

Figure 12A:

Referring to FIG. 12A, a third insulator layer 403 is formed on a substrate 401 using a deposition process. Substrate 401 may be a silicon substrate. The third insulator layer may include silicon oxide.

Figure 12B:
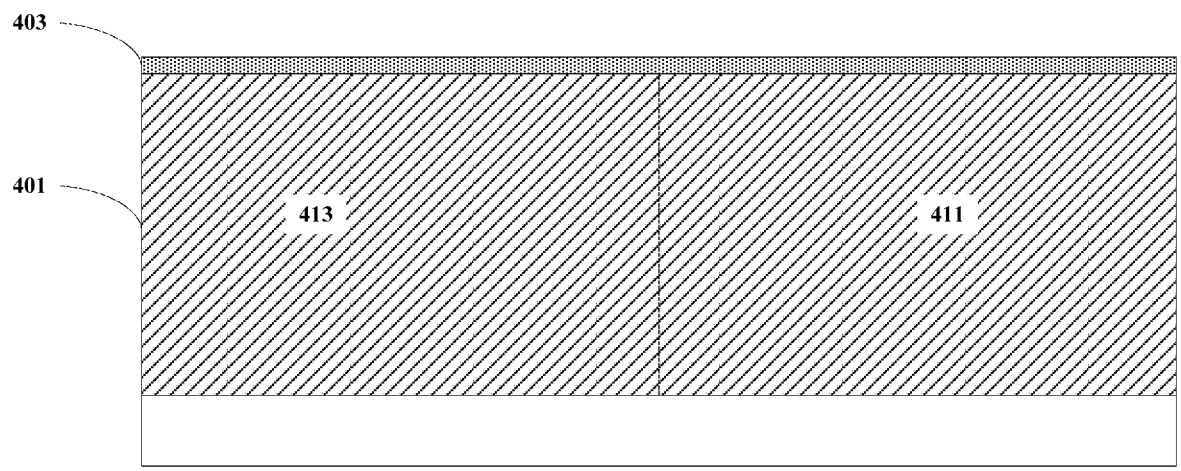

Next, referring to FIG. 12B, after forming third insulator layer 403, a doping process is performed on substrate 401 using, e.g., an ion implantation process to form a first region 411 in substrate 401. In this doping process, a third region 413 adjacent to first region 411 may also be formed. In one example, first region 411 and third region 413 of a same conductivity type may be formed by a single doping process. In another example, first region 411 and third region 413 of different conductivity types may be formed by two different doping processes.

In one embodiment, the conductivity type of first region 411 (or first region 411 and third region 413) is P-type, the doping process may be performed using an ion implantation process including implanting boron ions or boron fluoride ions, with the implantation dose in the range between $1.0 \times 10^{12}$ atoms/cm$^2$ and $5.0 \times 10^{13}$ atoms/cm$^2$, and the implantation energy in the range between 30 keV and 100 keV.

In another embodiment, the conductivity type of first region 411 (or first region 411 and third region 413) is N-type, the doping process may be performed using an ion implantation process including implanting arsenic ions or phosphorous ions, with the implantation dose in the range between $1.0 \times 10^{12}$ atoms/cm$^2$ and $5.0 \times 10^{13}$ atoms/cm$^2$, and the implantation energy in the range between 80 keV and 200 keV.

Figure 12C:
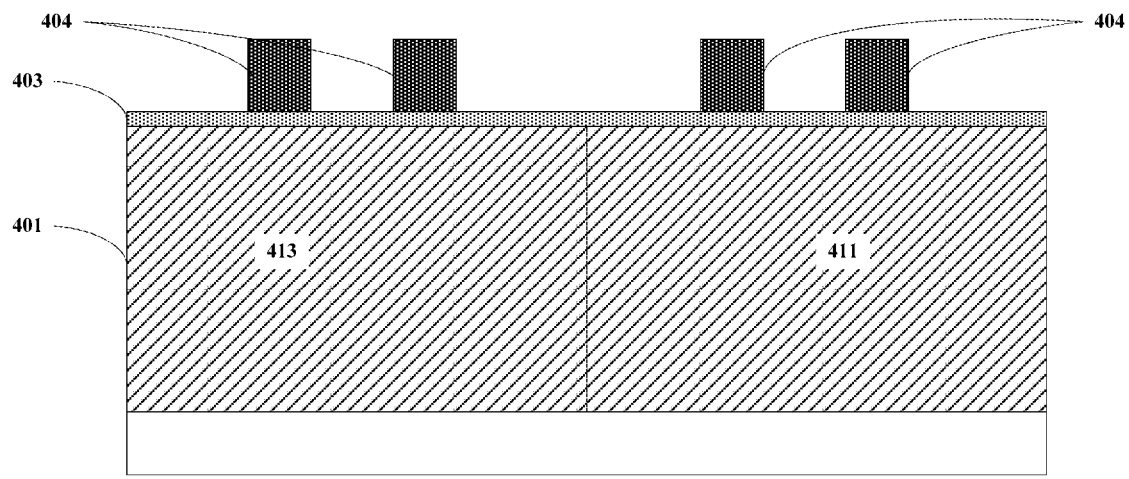

Next, referring to FIG. 12C, a patterned first hardmask layer 404 is formed on third insulator layer 403 using a photolithography and etching process. The first hardmask layer may include silicon nitride.

Figure 12D:
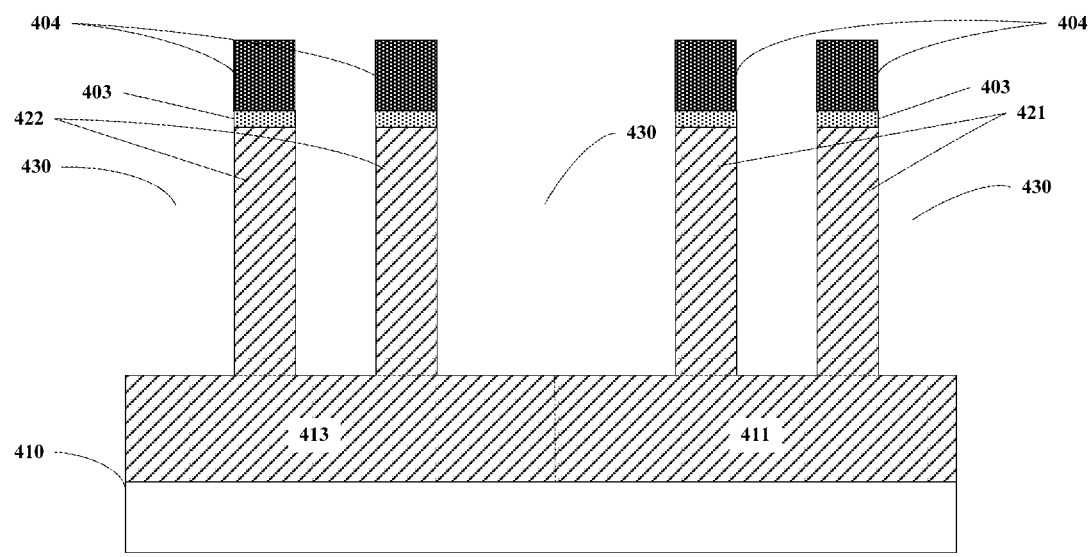

Next, referring to FIG. 12D, third insulator layer 403 and substrate 401 are etched using first hardmask layer 404 as a mask to form first semiconductor fin 421 and second semiconductor fin 422 that are separated from each other. A trench 430 is formed around first semiconductor fin 421 and second semiconductor fin 422.

Next, a first insulator layer is formed that partially fills the trench. The process of forming the first insulator layer will be described in connection with FIGS. 12E through 12H.

Figure 12E:
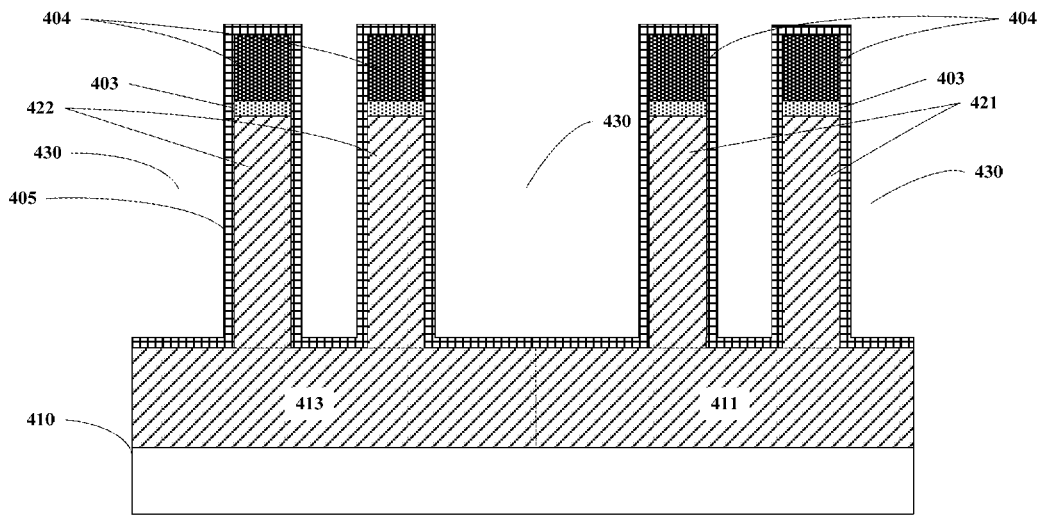

Referring to FIG. 12E, a fourth insulator layer 405 is formed, for example, using a deposition process, on the structure shown in FIG. 12D. In one embodiment, fourth insulator layer 405 is a liner oxide, e.g., silicon dioxide.

Figure 12F:
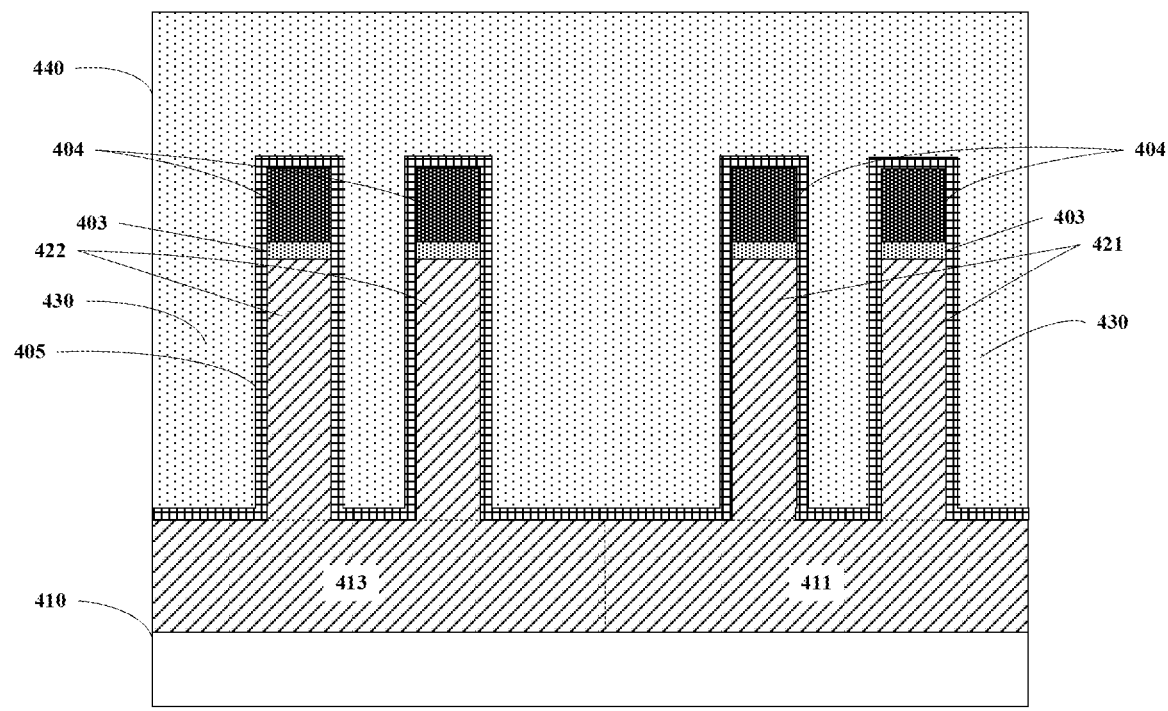

Next, referring to FIG. 12F, a first insulator layer 440 is formed, for example, using a deposition (e.g., a flow chemical vapor deposition (FCVP)) process, filling trench 430. In this step, a low-temperature annealing treatment may also be performing during the deposition process.

Figure 12G:
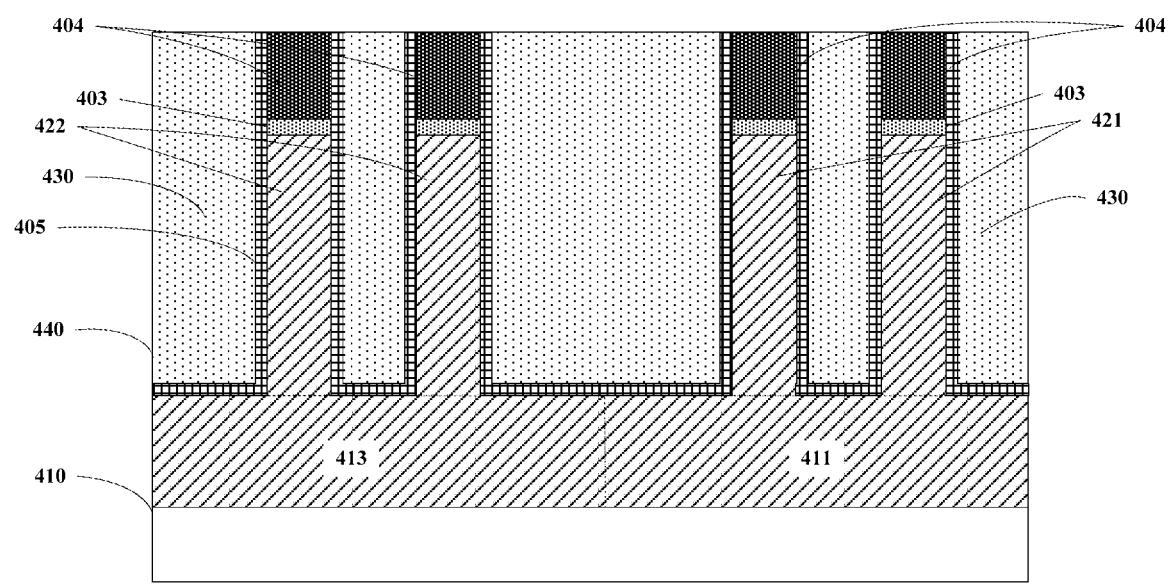

Next, referring to FIG. 12G, a planarization (e.g., chemical mechanical polishing (CMP)) process is performed on first insulator layer 440 to expose the upper surface of first mask layer 404.

Figure 12H:
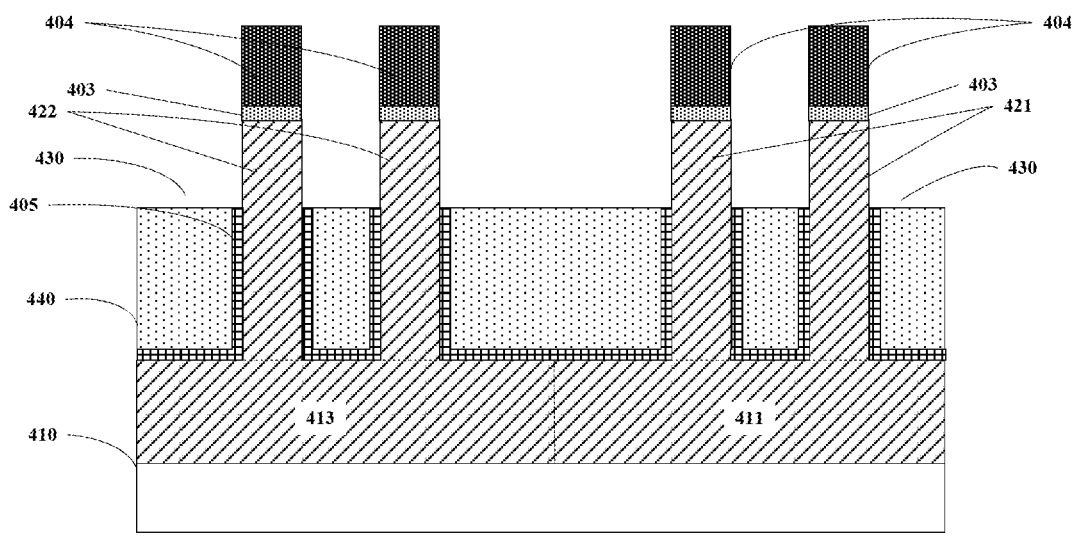

Next, referring to FIG. 12H, first insulator layer 440 and fourth insulator layer 405 are etched back to expose a portion of the semiconductor fin, for example, the exposed portion of the semiconductor fin is based on a required target height.

At this point, first insulator layer 440 is formed that partially fills trench 430.

Figure 12I:
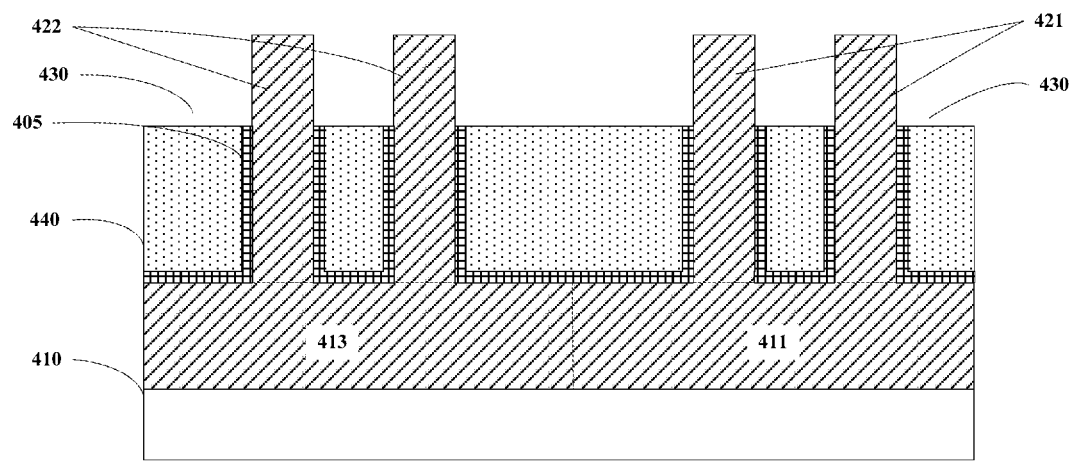

Next, referring to FIG. 12I, first hardmask layer 403 and third insulator layer 403 are removed.

Figure 12J:
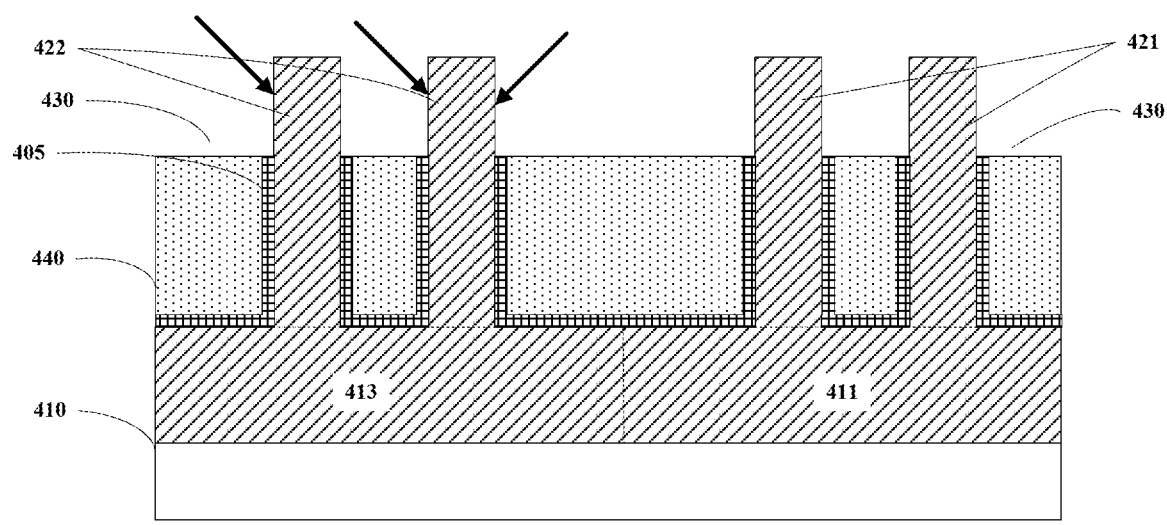

Next, referring to FIG. 12J, a doping process is performed on second semiconductor fin 422 for adjusting the threshold voltage (this doping is referred to as second doping) of the second semiconductor fin. For example, a patterned third mask layer (e.g., photoresist, not shown in FIG. 12J) is formed on first semiconductor fin 421 while exposing second semiconductor fin 422, the second doping process is then performed using an ion implantation process. Thereafter, the patterned third mask layer is removed.

Next, referring to FIGS. 12K1, K2, and K3, a second insulator layer 470 is formed (e.g., using a deposition or oxidation process) on a portion of the surface of first semiconductor fin 421 and second semiconductor fin 422. FIG. 12K2 is a cross-sectional view of FIG. 12K1 taken along the line P-P', and FIG. 12K3 is a cross-sectional view of FIG. 12K1 taken along the line Q-Q'.

Next, referring to FIG. 12L, a dummy gate structure 480 is formed on second semiconductor fin 422 for forming a MOS transistor. Dummy gate structure 480 may include a dummy gate 481 on a portion of second insulator layer 470, a second hardmask layer 482 on dummy gate 481, and spacers 483 on opposite sides of dummy gate 481.

Thus, embodiments of the present invention provide a method of manufacturing a semiconductor device.

The above-described method of forming the semiconductor structure may further include forming a fourth insulator layer 405 disposed between the semiconductor fin (e.g., first semiconductor fin 421 or second semiconductor fin 422) and first insulator layer 440. Thus, in some embodiments, the semiconductor structure may include fourth insulator layer 405. In other embodiments, the semiconductor structure may not include fourth insulator layer 405, as shown in FIGS. 4A through 4C.

References in the specification to "one embodiment", "an embodiment an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing an electrostatic discharge (ESD) protection device, the method comprising:
providing a semiconductor structure comprising a semiconductor substrate, which includes a first region of a first conductivity type, and a semiconductor fin on the semiconductor substrate;
performing an etch process on the semiconductor fin to form a recess in the semiconductor fin;
epitaxially growing an in-situ doped electrode in the recess; and
performing a doping process on the semiconductor structure to form a second region in the first region, the second region having a second conductivity type opposite the first conductivity type, wherein an interface between the first region and the second region forms a pn junction in the semiconductor substrate, and
wherein a portion of the first region has an upper surface that is not covered by a gate structure and flush with an upper surface of the second region.

2. The method of claim 1, wherein the second region has a doping concentration greater than a doping concentration of the first region.

3. The method of claim 1, wherein, prior to performing the doping process, the semiconductor fin is on the first region, and after performing the doping process, the semiconductor fin is on the second region.

4. The method of claim 1, wherein the first conductivity type is P-type, and the second conductivity type is N-type; or
the first conductivity type is N-type, and the second conductivity type is P-type.

5. The method of claim 1, further comprising:
forming a trench around the semiconductor fin;
forming a first insulator layer partially filling the trench, wherein the in-situ doped electrode is formed on the first insulator layer.

6. The method of claim 1, wherein performing the doping process comprises an ion implantation process; the first conductivity type is P-type, and the second conductivity type is N-type, the ion implantation process comprising arsenic ions or phosphorous ions, with a dose in a range between $1.0 \times 10^{14}$ atoms/cm' and $1.0 \times 10^{16}$ atoms/cm$^2$, and an energy in a range between 2 keV and 30 keV; or
the first conductivity type is N-type, and the second conductivity type is P-type, the ion implantation process comprising boron ions or boron fluoride ions, with a dose in a range between $1.0 \times 10^{14}$ atoms/cm' and $1.0 \times 10^{16}$ atoms/cm$^2$, and an energy in a range between 1 keV and 15 keV.

7. The method of claim 1, further comprising:
submitting the semiconductor structure to an annealing treatment after performing the doping process.

8. The method of claim 1, wherein performing the doping process comprises doping the semiconductor fin to have the second conductivity type.

9. A method for manufacturing a semiconductor device, the method comprising:
providing a semiconductor structure comprising a semiconductor substrate, which includes a first region of a first conductivity type, a first semiconductor fin and a second semiconductor fin on the semiconductor substrate and separated from each other, a trench disposed around the first and second semiconductor fins, a first insulator layer partially filling the trench, the first insulator layer comprising a first portion around the first semiconductor fin and a second portion around the second semiconductor fin;
performing a first etch process on the first portion of the first insulator layer such that an upper surface of the first portion of the first insulator layer is lower than an upper surface of the second portion of the first insulator layer;
performing a second etch process on the second semiconductor fin to form a first recess and a second recess and on the first semiconductor fin to form a third recess;
forming an electrode in the third recess of the first semiconductor fin;
forming a source and a drain, respectively, in the first recess and in the second recess of the second semiconductor fin; and performing a doping process into the semiconductor substrate having the formed electrode, the source and the drain to form a second region in the first region, the second region being of a second conductivity type opposite the first conductivity type, wherein an interface between the first region and the second region forms a pn junction in the semiconductor substrate, and wherein the electrode in the third recess of the first semiconductor fin has a volume that is greater than a volume of the source in the first recess of the second semiconductor fin or a volume of the drain in the second recess of the second semiconductor fin.

10. The method of claim 9, wherein the second region has a doping concentration greater than a doping concentration of the first region.

11. The method of claim 9, wherein, prior to performing the doping process, the first semiconductor fin is on the first region, and after performing the doping process, the first semiconductor fin is on the second region.

12. The method of claim 9, wherein:
the first semiconductor fin is for forming an electrostatic (ESD) protection device; and
the second semiconductor fin is for forming a metal-oxide-semiconductor (MOS) device.

13. The method of claim 9, wherein performing the first etch process on the first portion of the first insulator layer comprises:
forming a patterned first mask layer on the second portion of the first insulator layer and covering the second semiconductor fin while exposing the first portion of the first insulator layer;
etching the exposed first portion of the first insulator layer using the patterned first mask layer as a mask; and
removing the patterned first mask layer.

14. The method of claim 9, wherein performing the doping process comprises:
forming a patterned second mask layer on the second portion of the first insulator layer and covering the second semiconductor fin and exposing the upper surface of the first portion of the first insulator layer;
performing the doping process into the semiconductor substrate using the patterned second mask layer as a mask such that the second region has the second conductivity type; and
removing the patterned second mask layer.

15. The method of claim 9, wherein the semiconductor structure further comprises:

a second insulator layer overlying a portion of a surface of the first semiconductor fin and a portion of a surface of the second semiconductor fin, wherein performing the first etch process on the first portion of the first insulator layer further comprises removing the second insulator layer on the first semiconductor fin.

16. The method of claim 10, wherein providing the semiconductor structure comprises:
forming a third insulator layer on the semiconductor substrate;
performing a doping process into the semiconductor substrate to form the first region in the semiconductor substrate;
forming a patterned first hardmask layer on the third insulator layer;
performing a third etch process on the third insulator layer and the semiconductor substrate using the patterned first hardmask layer as a mask to form the first semiconductor fin and the second semiconductor fin, and the trench around the first and second semiconductor fins;
forming the first insulator layer partially filling the trench;
removing the patterned first hardmask layer and the third insulator layer;
performing a third doping process into the second semiconductor fin for adjusting a threshold voltage of the second semiconductor fin;
forming a fourth insulator layer overlying a portion of a surface of the first semiconductor fin and a portion of a surface of the second semiconductor fin; and
forming a dummy gate structure on the second semiconductor fin to form a MOS transistor, the dummy gate structure comprising a dummy gate on a portion of the fourth insulator layer, a patterned second hardmask layer on the dummy gate, and spacers on opposite sides of the dummy gate structure.

17. The method of claim 5, wherein the in-situ doped electrode comprises silicon germanium (SiGe) or silicon phosphide (SiP).

18. The method of claim 1, further comprising:
forming a body contact on the upper surface of the first region that is not covered by a gate structure and flush with the upper surface of the second region.

19. The method of claim 9, wherein forming the source, the drain and the electrode comprises an epitaxial growth process, and the doping process is performed in situ during the epitaxial growth process.

* * * * *